United States Patent [19]
Lampe et al.

[11] 4,035,629
[45] July 12, 1977

[54] EXTENDED CORRELATED DOUBLE SAMPLING FOR CHARGE TRANSFER DEVICES

[75] Inventors: Donald R. Lampe, Ellicott City; Marvin H. White, Laurel; James H. Mims, Linthicum Heights, all of Md.

[73] Assignee: Westinghouse Electric Corporation, Pittsburgh, Pa.

[21] Appl. No.: 625,694

[22] Filed: Oct. 24, 1975

Related U.S. Application Data

[63] Continuation-in-part of Ser. No. 507,115, Sept. 17, 1974.

[51] Int. Cl.$^2$ .................. H03K 5/159; G11C 11/40
[52] U.S. Cl. ........................... 235/193; 307/221 D; 328/167
[58] Field of Search ................. 235/193, 153 R; 340/146.1 R; 325/42, 65; 328/167; 307/221 D; 357/24; 333/18, 28, 70 T; 250/211 J

[56] References Cited

U.S. PATENT DOCUMENTS

| | | | |
|---|---|---|---|
| 3,781,574 | 12/1973 | White et al. | 307/221 D X |
| 3,819,953 | 6/1974 | Puckette et al. | 307/221 D |
| 3,919,468 | 11/1975 | Weimer | 307/221 D X |
| 3,956,585 | 5/1976 | Butler et al. | 333/70 T X |

Primary Examiner—Joseph F. Ruggiero
Attorney, Agent, or Firm—H. W. Patterson

[57] ABSTRACT

Extended correlated double sampling (ECDS) for charge transfer devices (CTD) corrects for errors arising in components of the CTD system from the input to the output thereof. Sources of error include bias variations and non-uniformity of thresholds and leakage currents. While applicable to any type of CTD system, for a TDI (time delay integration) application, precise error correction is achieved. Alternate signal level samples and reference level samples, the latter preferably AC zero, are propagated down the CTD channel as a related pair. At the CTD output, the signal and reference level samples of each pair are differenced, thereby correcting the resultant output signal for the noted types of errors. ECDS is compatible with CDS as taught in U.S. Pat. No. 3,781,574 and the two may be used jointly. An application of ECDS in the TDI mode for enhancement of signal outputs from a sensor array is disclosed, along with special parallel signal injection structure and operation for the requisite parallel signal injection into the channel, and special techniques of stabilized charged injection (SCI).

26 Claims, 44 Drawing Figures

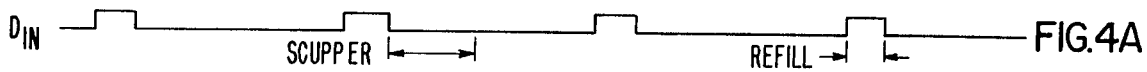
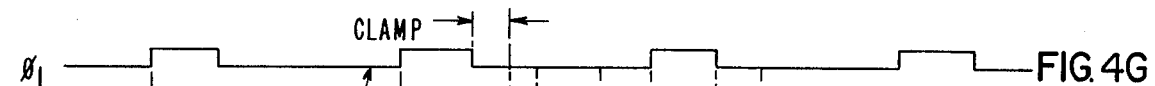
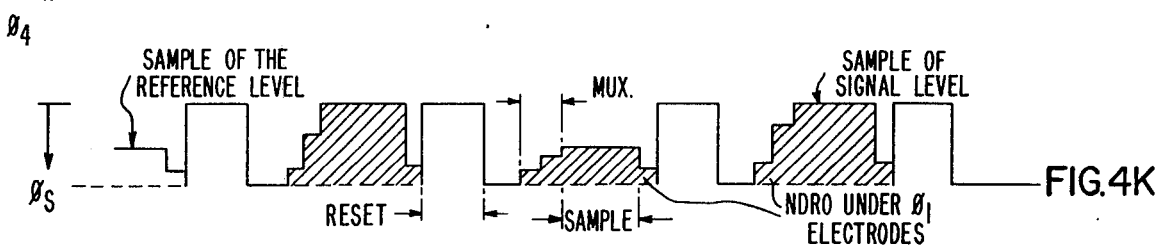
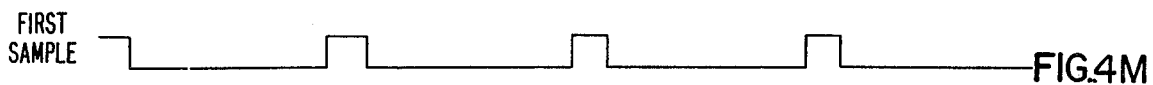
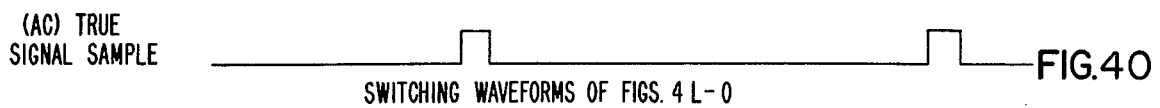

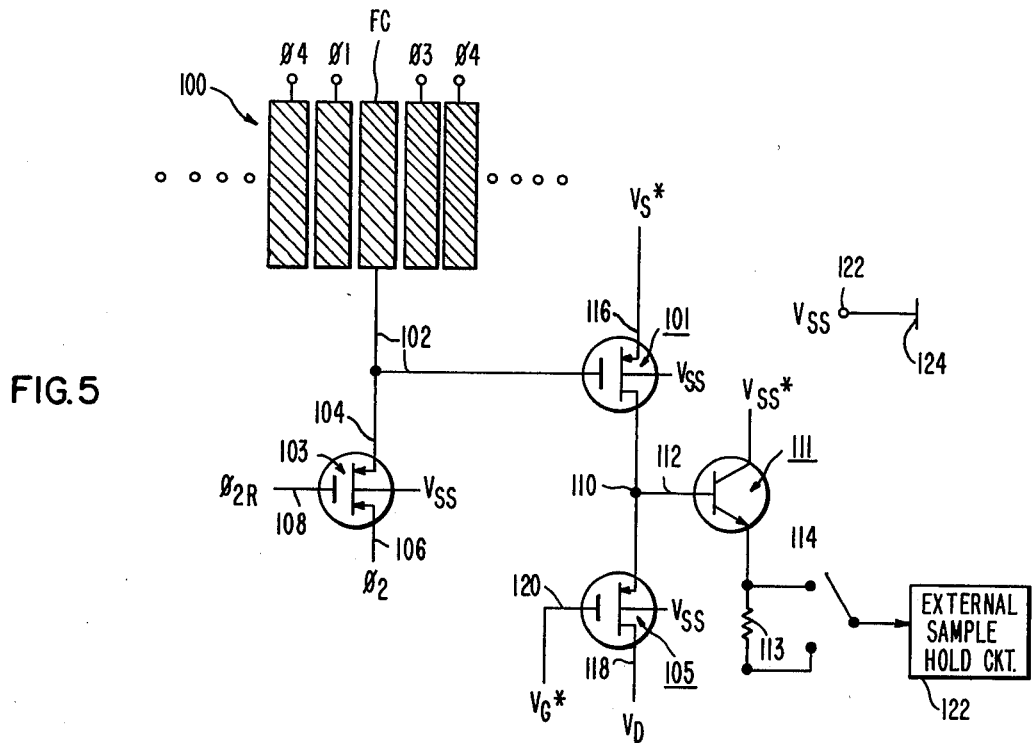
FIG. 5

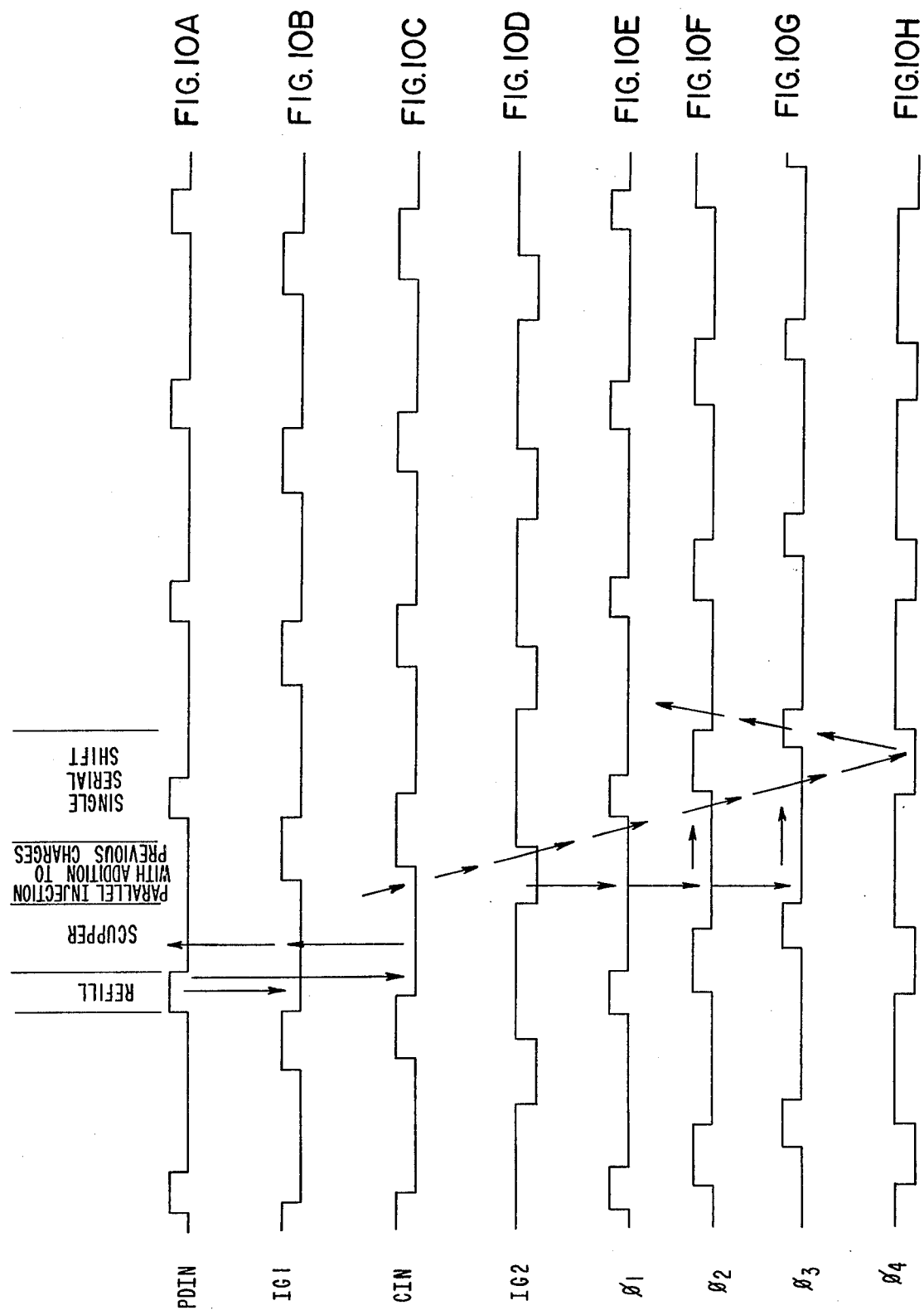

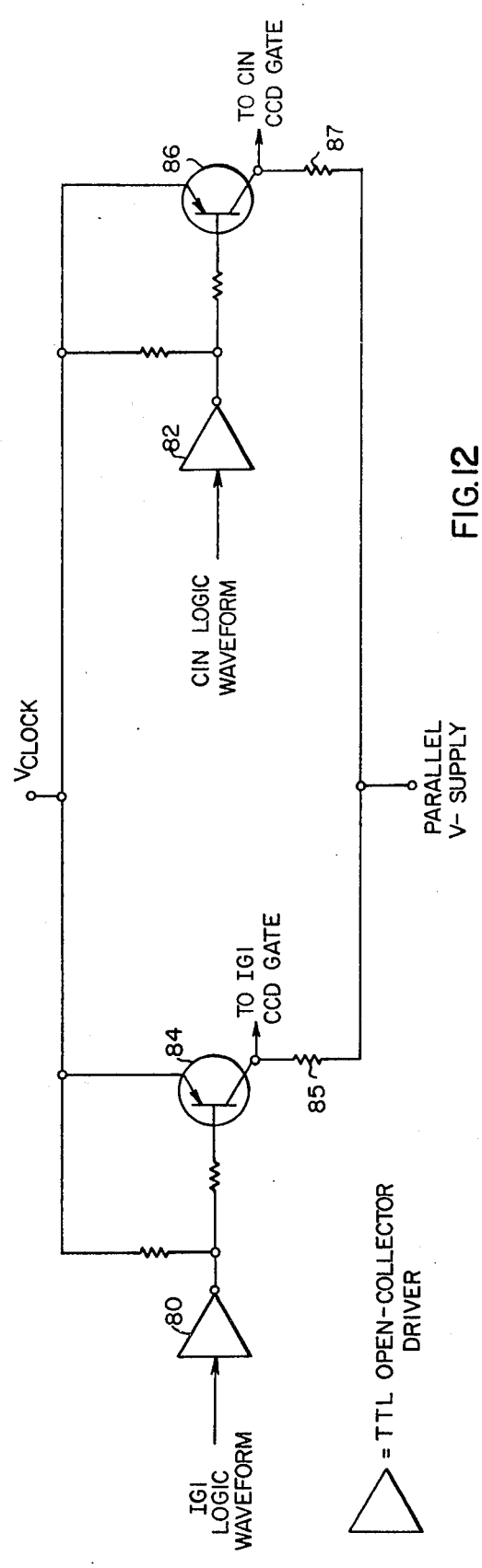

EXTENDED CORRELATED DOUBLE SAMPLING FOR CHARGE TRANSFER DEVICES

CROSS REFERENCE TO PARENT APPLICATION

This is a continuation-in-part of application Ser. No. 507,115 filed Sept. 17, 1974, entitled, A PROGRAMMABLE ANALOG TRANSVERSAL FILTER, assigned to the common assignee hereof.

BACKGROUND OF THE INVENTION

1. Field of the Invention

This invention relates to charge transfer devices (CTD) and, more particularly, to a technique termed extended correlated double sampling for correction of errors in the output signals from a CTD.

2. State of the Prior Art

In the prior art, digital signal processing (DSP) has been utilized in many applications in view of the low cost of the integrated circuits that are available to perform many functions in digital fashion. As compared with analog techniques, DSP has been preferred in that its use of digital implementation has been considered to be preferable in view of cost, weight, flexibility and accuracy considerations. By contrast, the only present advantage of analog techniques is its lower power consumption, which advantage may gradually disappear as technology advances. A further technique known as discrete analog signal processing (DASP) provides an alternative to the aforementioned methods of signal processing and is implemented by sampling at regular intervals an analog signal to provide a series of analog signals or samples, each of which may be operated upon one-at-a-time and have an amplitude containing information on data corresponding to M digital bits, where one bit of resolution in DSP is equivalent to 6dB dynamic range in the analog signal. Experiments have shown that a signal-charge analog packet can be shifted through a typical CTD nearly unattenuated, limited by the size of the holding wells and the minimum detectable output signal.

As more fully described in an article entitled "Charge Coupled Semiconductor Devices": appearing in *Bell System Technical Journal*, April 1970 by W.S. Boyle and G. E. Smith, CCD's sample an analog input signal to provide a series of discrete analog charge packets to be stored in potential wells created at the surface of a semiconductor and transported along the surface by timing signals. More particularly, these charges constitute minority carriers stored at the silicon-silicon dioxide interface of capacitors and are transferred from capacitor or well to capacitor or well on the same substrate by manipulating the voltages applied across the capacitor.

It has been known heretofore in the prior art to utilize a zero reference in conjunction with an analog signal to provide more accurate interpretation of the analog signal levels. Voltage drift and bias errors, of course, exist in any type of analog circuit. For example, in telemetry, a so-called "return-to-zero" technique has long been known in which alternate signal and reference samples are transmitted, such as from a satellite to a ground station. This technique permits correction of voltage drift and bias errors at the receiver by subtracting the received zero reference from the received signal sample.

U.S. Pat. No. 3,781,574 — White et al., assigned to the common assignee, discloses a coherent sampled read-out circuit and signal processor. In one embodiment disclosed in the patent, this circuit and processor are coupled to a CCD shift register. In fact, the circuit and processor of the patent have applicability to any type of device from which an analog charge signal readout is to be obtained, for purposes of minimizing the degradation of the readout signal and minimizing any noise contribution due to the readout operation. The term coherent sampling as employed in that patent corresponds to a term employed herein of "correlated double sampling" (CDS). The technique of the 3,781,574 U.S. Pat. No. relates principally to output operations and hence may be applied to any system producing an analog charge output such diode arrays, and CTD, including CCD, systems.

SUMMARY OF THE INVENTION

The present invention relates to a technique termed extended correlated double sampling which provides for correction of voltage drift and bias errors occurring both at the input and the output of the device and occurring in the device itself, i.e., as structured between the input and output. Again, the devices in question are of the analog type and particularly analog delay type devices which may include addition capability as well. The present disclosure specifically illustrates a CCD, or more broadly a CTD, having both delay and add capabilities. Other examples of analog delay devices include surface acoustic delay lines; even earlier analog delay devices include helices of coaxial cable and LC tank circuits. In general, the type of analog delay device is not itself critical to the applicability of the techniques of the present invention to correct for these problems of voltage drift and bias errors which may occur.

An early suggestion for achieving cancellation of bias errors and drift consistent with the techniques of extended correlated double sampling is provided in an article entitled, "An Electrically Programmable LSI Transversal Filter for Discrete Analog Signal Processing (DASP) by Lampe et al., published in Proceedings, CCD Applications Conference 18–20, Sept. 1973, San Diego, Calif.

The above cited parent of this CIP application, application Ser. No. 507,115 filed Sept. 18, 1974, entitled, A PROGRAMMABLE ANALOG TRANSVERSAL FILTER of Lampe et al and assigned to the common assignee hereof discloses in somewhat greater detail, both as to theory and implementation, a system performing extended correlated double sample (ECDS). It will be understood that ECDS provides for correction of voltage drift and bias errors, and therein including such sources of error as threshold non-uniformities across device arrays. Threshold non-uniformities and leakage current non-uniformities, of course, have effects similar to a bias error and, in effect, the output signal errors are indistinguishable as between originating from bias errors or threshold and leakage current non-uniformities.

In conclusion, the CDS, or coherent double sampled, techniques as taught in the 3,781,574 U.S. Pat. No. are directed to achieving optimum low noise signal outputs of analog devices, such as a CCD, by correlated double sampling and differencing of the noise inherent in the on-chip, gated charge integrator readout circuit, thereby eliminating this noise component from the video output. The ECDS technique of this invention expands this compensation or error correction capability to encompass the entire device, including input and output. Specifically, the ECDS technique permits cancellation of device threshold and leakage non-uniformities and bias errors.

BRIEF DESCRIPTION OF THE DRAWINGS

FIGS. 4A through 4O are waveforms of control and other signals, FIG. 4K being a waveoform illustrating potential well conditions in a manner similar to FIG. 2B;

FIG. 5 is a schematic of a floating clock sensor technique for non-destructive readout from a CCD, shown in a parallel output (PO) configuration and useful with ECDS;

FIGS. 6A through 6E comprise waveforms of control signals utilized for operation of the circuit of FIG. 5;

FIGS. 10A through 10H comprise operating waveforms for the SCI and CCD shift channel for explaining TDI operation with parallel charge injection as one form of application of ECDS;

FIG. 12 is a schematic of a circuit for generating the waveforms of FIGS. 10B and 10C.

DETAILED DESCRIPTION OF THE PREFERRED EMBODIMENTS

General Description of CCD and Stabilized Charge Injection (SCI)

Figure 1A:
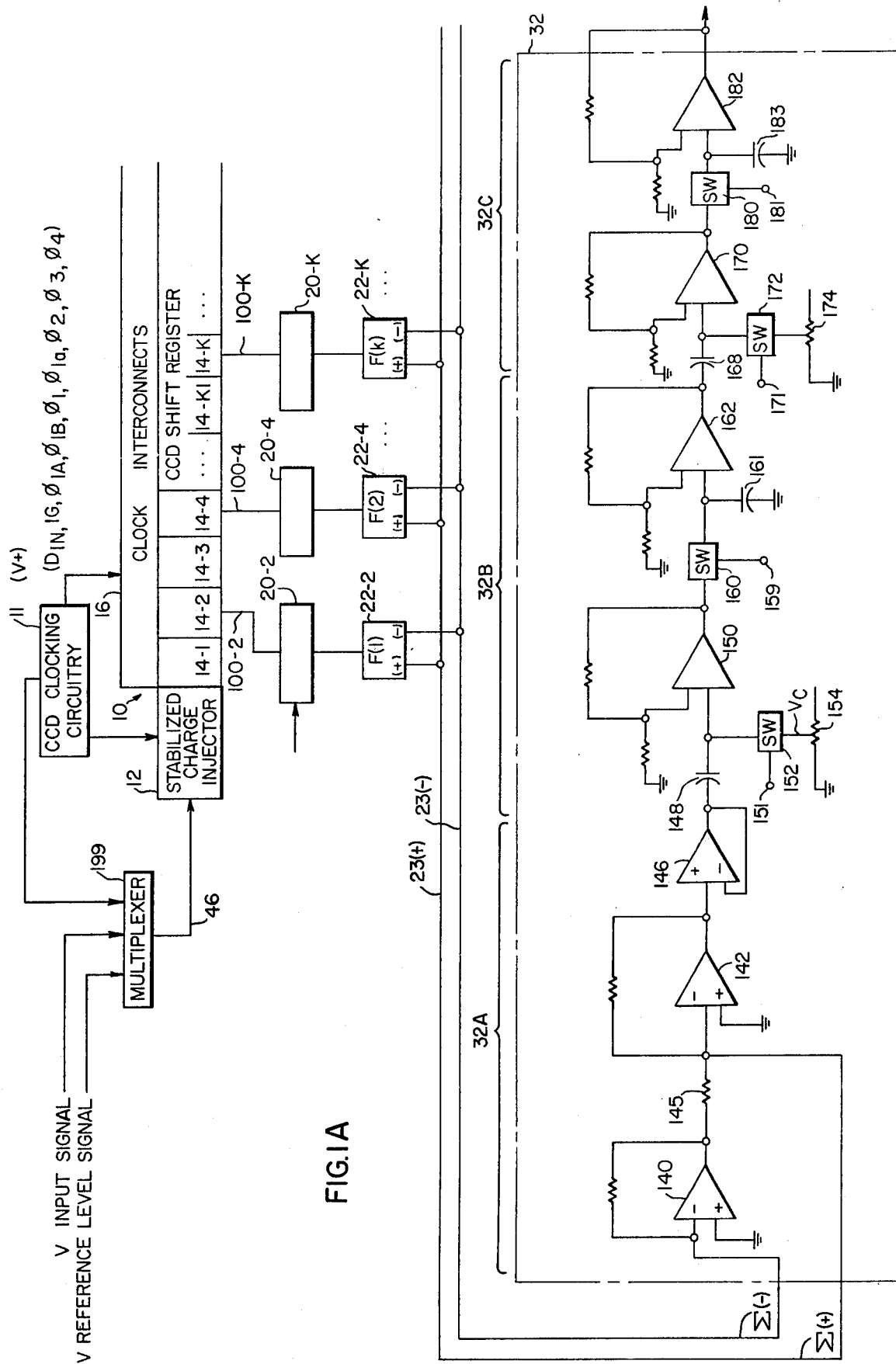
FIG. 1A is a schematic, partly in block diagram form, of a CTD and specifically a CCD system incorporating ECDS in accordance with the invention.

FIG. 1A of the drawings illustrates in schematic form a discrete analog processing system in accordance with teachings of this invention and comprising a charge transfer device illustratively taking the form of a charge coupled device 10 (CCD) and including a stabilized charge injector 12 for injecting the input signal charges into the CCD 10. A CCD master clock circuit 11 provides suitable clock signals for operation of the injector 12 and the CCD shift register 10 through the clock interconnects 16, in known fashion. The clocking circuitry 11 provides a number of output signals as indicated in FIG. 1A, including four-phase clocks $\phi 1$ through $\phi 4$. These various signals are shown and discussed in relation to FIGS. 4A through 4J.

The CCD shift register 10 includes a plurality of stages through which the charge packets are propagated under control of the clocking signals, those stages being shown as 14-1, 14-2, . . . in FIG. 1.

Figure 1B:
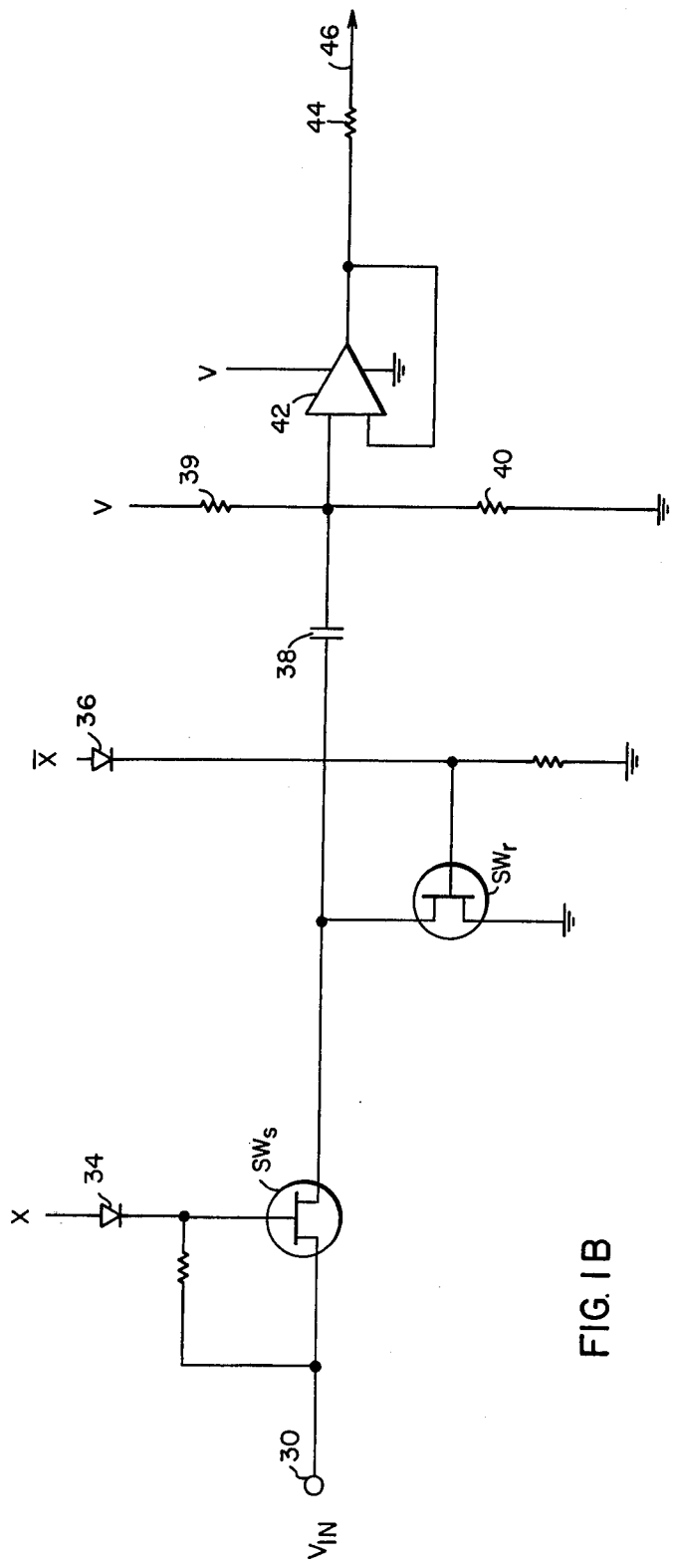
FIG. 1B is an illustrative schematic of a multiplexer employed in FIG. 1A for alternate injection of signal and reference level signals into the CCD in accordance with the CDS.
Figure 2A:
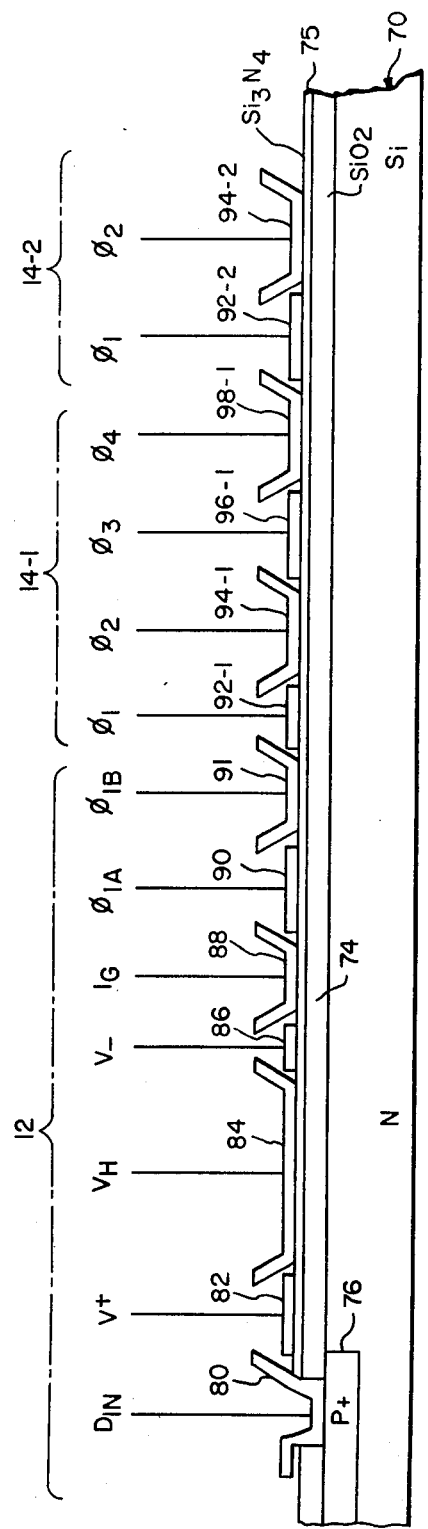
FIG. 2A is an illustrative cross section, partly in schematic form, of a CCD channel and associated electrodes including the structure related to a stabilized charge injector (SCI)

FIG. 2A is a schematic cross-sectional view of the stabilized charge injector 12 and the first two stages 14-1 and 14-2 of the CCD shift register 10 of FIG. 1. As shown a substrate 70 of silicon (which may be an epitaxial layer on a further substrate) includes a P+ type source region 76 formed within the substrate 72 and a source contact 80 formed through a window in the silicon dioxide layer 74 and the silicon nitride layer 75, in direct contact with the region 76. Signal injection is achieved primarily through the use of the electrodes 80, 82, 84, 86 and 88, to 82, 84 and 86 of which the biasing potentials V+, $V_H$ and V− are applied. Generally, the voltage signals V+ and V− as shown in FIGS. 4C and 4D, respectively, establish a charge distribution as seen in FIGS. 3A to 3D within the silicon substrate layer 70. In particular, the input signal is applied to either the V+ electrode 82 or the V− electrode 86, for the control of the injection of the charge packets into the first and subsequent wells of the CCD 10. $\phi_{1A}$ and $\phi_B$ electrodes are provided to facilitate the injection of the large amounts of charge needed for the maximum allowable propagating charge packet, $Q_{MAX}$. The injected charge then is transferred successively beneath the $\phi 1$, $\phi 2$, $\phi 3$ and $\phi 4$ electrodes of the successive groups 14 to be transferred along the length of CCD 10. The various signals as applied to the electrodes of the stabilized charge injector 12 as well as the shift register portion of the CCD 10 are shown in FIGS. 4A to 4J.

Figure 3A:
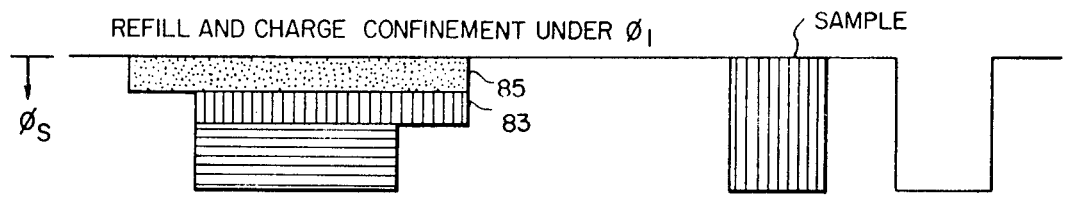
FIGS. 3A through 3D are more detailed views as in FIG. 2B illustrating successive SCI operations.

The first or refill step of injecting the signal into the CCD 10 in shown in FIGS. 3A and 4A by pulsing the DIN electrode 80 to a potential near the potential of the substrate 70. During the refill phase as shown in FIG. 3A, the charge uncertainty is limited by the following equation:

$$q_n^2 = kT(C_+ + C_H + C_-) \quad (3)$$

Figure 3B:
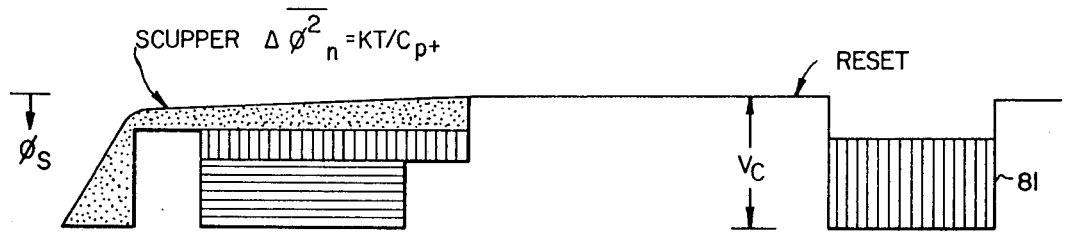

These charge fluctuations are meaningless since in the next step as shown in FIG. 3B, the minority carriers near that charge level are drained or "scuppered" from the upper part 85 of the well established beneath the electrodes 84 and 86 back into the P+ diffusion region 76, which now is reverse-biased, until the charge level within the well 83 underneath the electrodes 84 and 86 reaches the voltage level as applied to the V+ gate electrode 82. In other words, all of the excess charges including those which give rise to the population variation or randomness as expressed in equation (3), are scuppered into the drain region 78 until the surface potential at the $V_H$ and V− electrodes 82 and 86 equals the surface potential underneath the V+ electrode, which has noise fluctuations given by the equation:

$$\overline{\Delta\emptyset_n{}^2} = kT/C_{P+} \tag{4}$$

where $C_{P+}$, $C_P{}^-$ and $C_{PH}$ equal the total on-chip plus off-chip capacitances at the nodes associatee with the V+ electrode 82, the V− electrode 86 and the $V_H$ electrode 84, respectively.

As seen in FIGS. 2A and 4A, the source diffusion 76 is biased by the voltage applied to the electrode 80, whereby all the minority carriers near the charge level as given in the equation (3) within the well formed beneath the electrodes 82, 84 and 86 as shown in FIG. 3B, are drained or scuppered back into the diffusion region 76. At the end of the scupper process, the excess or random charges have been removed from this uppermost part 85 of the well beneath the electrodes 82, 84 and 86.

Next, the injection gate is enabled by applying a negative-going inject pulse IG as shown in FIG. 4B to the injection gate electrode 88, whereby positive charges are permitted to flow into the first receiving well 89 beneath the IG electrode 88, the $\emptyset_{1A}$ electrode 90 and $\emptyset_{1B}$ electrode 91, and $\emptyset_1$ electrode 92-1. The minority carriers continue to flow until the surface potential beneath the $V_H$ electrode 84 equals the surface potential beneath the V− (86), which has a potential noise fluctuation in accordance with the equation:

$$\overline{\Delta\emptyset_n{}^2} = kT/C_{P-} \tag{5}$$

Electrode 84 may be electrically connected to electrode 86 or an independent negative voltage may be applied to electrode 84 to establish a depletion region which acts as a minority carrier holding well 93. During this injection period, any potential fluctuation on the $V_H$ electrode 84 injects undesired charge randomness given by the equation:

$$q_n = C_H \cdot \Delta\emptyset_n, \text{ where } \overline{\Delta\emptyset_n{}^2} = kT/C_{PH} \tag{6}$$

Figure 3C:
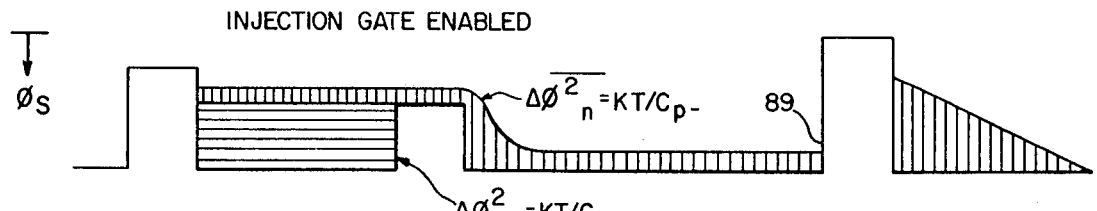

The input signal as shown in FIG. 4D may be applied to either the V+ electrode 82 or the V− electrode 86 whereby the quantity of charges permitted to flow into the well 89 is controlled as shown in FIG. 3C. Further, equations (4), (5) and (6) as given above may be expressed as follows:

$$Q_{SIG} = (C_H + C-) (V_+ - V_-) \tag{7}$$

and $$q_n{}^2 = (C_H + C_-)^2 \cdot (kT/C_{P+}) + (C_H + C_+)^2 \cdot (kT/C_{P+}) + C_H{}^2 \cdot (kT/C_{PH}) \tag{8}$$

or $$q_n{}^2 \cong (C_H + C_-)^2 \cdot kT \cdot (C_{P+}{}^{-1} + C_{P-}{}^{-1} + C_{PH}{}^{-1}) \tag{9}$$

The last factor of equation (9) is simply the equivalent series combination of the total off-chip parasitic and on-chip capacitance at the V+ electrode 82, $V_H$ electrode 84 and V− electrode 86, which may be expressed by the term $C_P$, permitting the following equation:

$$q_n = (C_H + C_-) \cdot (kT/c_P)^{1/2} \tag{10}$$

In FIG. 2A there is shown electrodes $\emptyset_{1A}$ and $\emptyset_{1B}$ 90 and 91 which facilitate the injection of large amounts of charge into the well 89 therebeneath to permit the maximum allowable propagating charge packet $Q_{MAX}$.

As seen in FIGS. 4E and 4F, negative-going pulses are applied to the electrodes 90 and 91 during the injection step, whereby a maximum amount of charges are disposed in the well 89. If $V_C$ denotes the surface potential differences generated by the clock signals $\emptyset_1$ to $\emptyset_4$ and $V^1$ indicates the surface potential when $Q_{MAX}$ is disposed within the region 89 underneath electrodes 91 and 92, the following relationship is obtained:

$$Q_{MAX} = C_1 \cdot V_C = (C_H + C_-)(V_+ - V) = (C_{1A} + C_1) \cdot (V_C - V^1) \tag{11}$$

Figure 3D:
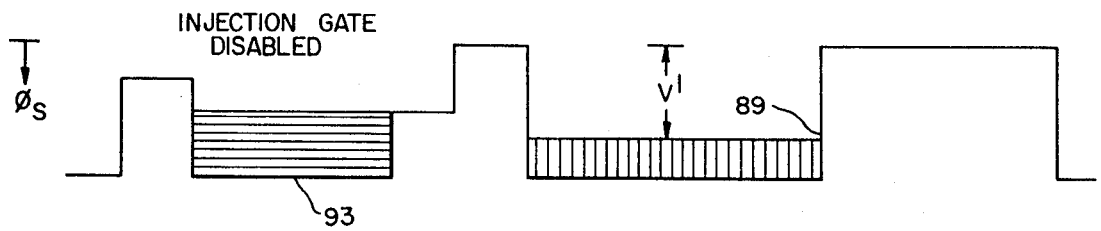

In the final step of operation as shown in FIG. 3D, the injection gate is disabled when the injection gate signal as shown in FIG. 4B returns to a more positive level, thereby raising a barrier across which the charges do not flow back into the holding well 93 beneath the electrode 84; if the charges were permitted to flow back, an extra uncertainty would be introduced into the signal processing. The barrier potential must rise slowly compared to the speed of charge flow forward into the receiving well 89. To help this forward flow of charges, the effective drain potential $V^1$, must be kept sufficiently below the effective source potential V− to provide the desired longitudinal drift fields for moving the charge forward in accordance with the following equation:

$$(V_+ - V_-) - V^1 > V_{MIN} \tag{12}$$

From equations (11) and (12), the capacitances are selected and thereby the area of the corresponding electrodes in the formation of the integrated circuit.

Figure 2B:
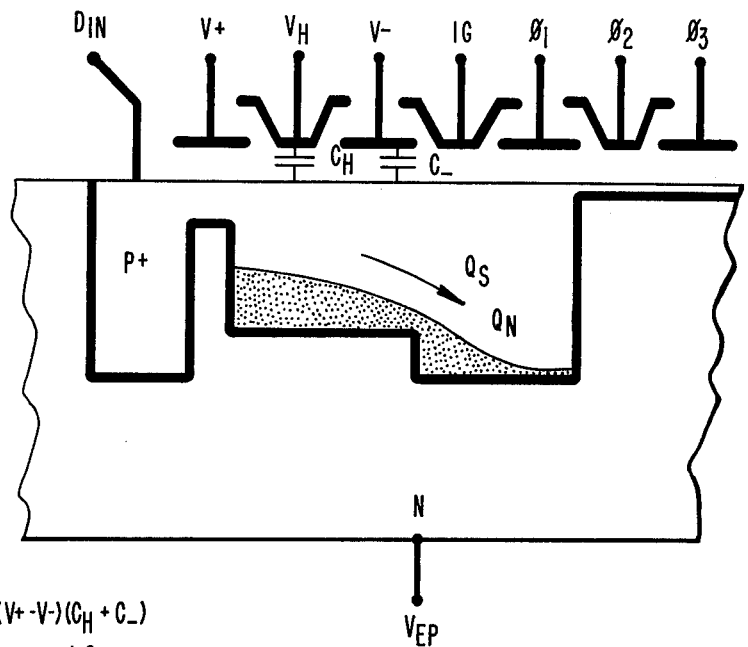
FIG. 2B is a schematic illustration of the SCI including illustrative potential well conditions during SCI operations.

From equations (7) and (11), it is seen that the amount of charge injection is linearly related to the input signal voltage V− as shown in FIG. 4D by the factor of the capacitances ($C_H + C-$). Since these capacitances are essentially determined by the characteristics of the silicon dioxide layer 74 and the silicon nitride layer 75, they are independent of the charge storage potential applied, giving the desired signal-voltage-to-injected-charge linearity to therby meet one of the requirements for DASP. (See FIG. 2B, schematically showing the input capacitances).

After the charge packet has been transferred into the well beneath the $\emptyset_1$ electrode 9201 of the first cell 14-1, the charge packet is transferred from well to well along the linear length of the CCD 10 under control of the phase clock signals $\emptyset_1$, $\emptyset_2$, $\emptyset_3$ and $\emptyset_4$, as shown respectively in FIGS. 4G to 4J. It is understood that the $\emptyset_1$, $\emptyset_2$, $\emptyset_3$ and $\emptyset_4$ clock signals are applied to the corresponding electrodes 92, 94, 96 and 98 of each of cells 14 of the CCD 10. Generally, the charge packet is transferred from well to well by an attractive voltage (shown in the waveforms of FIGS. 4G to 4J as a relatively low amplitude) applied to the next electrode, and thereafter applying a repulsive voltage (shown in the voltage waveforms as a relatively high amplitude) to the well from which the minority charge carriers are attracted. The transfer of the charge carriers from well to well is generally shown in FIGS. 4G to 4J by arrows indicating that the carriers are transferred from well to well by successive application of attractive voltages ($\emptyset_1$ to $\emptyset_4$) to the corresponding successive electrodes; the charge packet is further transferred from the well underneath the $\emptyset_4$ electrode of one stage 14 to the well beneath the $\emptyset_1$ electrode of the next, successive stage 14.

Extended Correlated Double Sampling ECDS)

From the foregoing discussion of charge propagation in a CCD, it will be appreciated that certain sources of noise and/or errors in the output charge packet exist. These include non-uniformities of threshold and leakage current conditions within the successive wells of the CCD channel through which the charge packet propagates, and also bias errors such as may occur from drifting of the biasing sources. Compensation of these sources of error must be provided to achieve desired linearity and accuracy. The technique of the present invention provides the necessary correction for these errors. The technique is termed hereinafter ECDS, for "Extended Correlated Double Sampling". In general, ECDS provides for alternatively injecting samples of the input signal and a reference level signal whereby the successive signal samples, or charge packets, are separated by the reference level signals, or charge packets. The reference level signals may be visualized as affording sample-to-sample isolation; equally valid is the visualization of the same as affording isolation cells surrounding each signal cell. The reference signal level need not be alternated with all of the data sample signals, if reduced sample-to-sample isolation is acceptable, thus permitting only one reference signal for every predetermined number of signal samples instead to be employed. The following discussion, however, assumes that alternate reference and signal samples are propagated down the CCD channel.

The only requirement on any auxiliary signal, i.e., the reference signal, carried in the isolation cells is that it not contribute a varying amount of charge to the succeeding data-carrying stages, which then becomes indistinguishable from the desired data. Any DC reference level fulfills that requirement, but a specially useful DC reference corresponds to the AC zero signal level. In this case, both the reference AC zero and the analog signal with reference bias appear sequentially interleaved at the CCD output.

Differencing the "reference only" and "signal plus reference" levels via the "clamp-sample-hold" techinque of "extended correlated double sampling" (ECDS) then yields the desired error correction. Since both the reference only sample and signal plus reference sample follow the same path, they both interact with the same electrodes and thus give outputs determined by the same set of threshold voltages. Therefore output subtraction cancels any effects of MOS threshold non-uniformities and biasing errors with reduced sensitivity to leakage current non-uniformities. For applications where both samples dwell equally long at every point along their path, the leakage charge accumulated in both samples is identical and cancels exactly when the two samples are differenced at the output.

When the alternate reference level and signal level samples are employed, the sample-to-sample isolation above noted affords a further significant advantage in the reduction of crosstalk between successive signal samples. Specifically, the sample-to-sample isolation, $\epsilon$, as referred to the CCD, may be defined by the relative signal content of a CCD output charge packet:

$$\epsilon = \frac{\text{charge remaining from original signal sample}}{\text{charge added from preceding signal charge packets}}$$

Thus, $\epsilon$ is a measure of the extent to which one signal charge packet remains free from charge contributions from preceding signal charge packets corresponding to other independent samples of the signal. (The related phenomenon of crosstalk between signal samples occurs when a parallel in/serial out (PI/SO) CCD is used in a multiplexer.) Inadequate sample to-sample isolation most generally results in degraded signal processing performance.

An illustrative implementation of ECDS is shown in FIGS. 1A and 1B and will be explained with reference to the waveforms of FIGS. 4K through 4O. In FIG. 1A, multiplexer 199 alternately samples the data signal labelled "V input signal," and the reference signal labelled "V reference level signal" and supplies alternate samples thereof to the stabilized charge injector 12.

An illustrative implementation of the multiplexer 199 is shown in FIG. 1B; it is to be understood that the circuit elements of FIG. 1B may be provided in a monolithic structure with the CCD 10 and other elements shown in FIG. 1A.

In FIG. 1B, the V input signal is applied to the input signal node 30 and the V reference level signal is derived from the DC potential shown as a ground terminal. Transistor $SW_S$ is the signal sampling switch and transistor $SW_R$ is the reference level sampling switch, these transistor switches respectively being rendered conductive in alternate time intervals by the multiplexing signals X and $\overline{X}$ applied thereto through diode couplers 34 and 36. As noted, signals X and $\overline{X}$ are alternately enabling for their respective transistors so as to provide alternate signal and reference level signal samples. The samples are coupled through capacitor 38 and applied through biasing resistor divider 39, 40 to an input of an operational amplifier 42. Resistor 44 then receives the output of the amplifier 42 so as to apply these alternately selected signal and reference level signal samples to output line 46 which corresponds to the output from multiplexer 199 to the input of stabilized charge injector 12 in FIG. 1A.

The CCD 10 in FIG. 1A is shown as having parallel outputs 100-2, 100-4, . . . 100-K, . . . extending from alternate stages of the shift register 10 and, specifically, 14-2, 14-4 and 14-K. Output circuits 20-2, 20-4, and 20-K, respectively, receive the alternate input and reference level signals in successive time intervals as they appear at the outputs from the stages 14-2, 14-4, . . . . Transfer function circuits 22-2, 22-4, and 22-K receive the outputs from the corresponding output circuits and generate a prescribed output versus input. Differential outputs (shown as + and − ) of the circuits may be supplied in common to summing busses 23 (+) and 23 (−), as indicated; or alternatively, a single-sided (non-differential) may be connected to a single summing bus.

Also shown in FIG. 1A is a so-called analog reconstruction circuit 32. As will be subsequently become clear, this circuit has the capability both of functioning to provide ECDS in accordance with the invention and in a manner compatible therewith, to provide CDS in a manner provided by the teachings of U.S. Pat. No. 3,781,574. To assist in visualizing the components of the circuit 32, (32a) comprises a differential input circuit for receiving the summed differential outputs of the circuit 22; portion 32b includes circuit elements for implementing CDS in accordance with U.S. Pat. No. 3,781,574, and section 32c comprises the ECDS portion of the circuit 32.

Rather than having two summed signals ($\Sigma(+)$ and $\Sigma(-)$), each of the parallel outputs 100-2, 100-4, ... from CCD 10 may be processed separately and specifically by a corresponding circuit 32. Also, a serial output from CCD 50 may be derived and processed by a single circuit 32. For parallel readout, non-destructive sensing of course is implied for most cases, whereas serial readout normally is destructive.

The operation of the circuit 32 will be more readily understood with reference to the waveforms of FIGS. 4K through 4O. FIG. 4K shows the alternate signal level and reference level charge packet distributions and their relative amplitudes. For the moment, both the signal and reference levels will be treated as signals for purposes of explaining the CDS circuit function.

As seen in FIGS. 4G through 4J, 4-phase clocking of the gate electrodes is employed. Moreover, the waveforms in the foregoing discussion assume that gate electrode $\phi_1$ is the sensor electrode. It furthermore is assumed for the parallel output shown in FIG. 1A that non-destructive sensing is being performed. Examples of suitable non-destructive sensing techniques are set forht hereinafter.

For the charge packet propagation shown in FIGS. 4G through 4J, it is seen that $\phi_1$ goes high or repulsive and, after $\phi_2$ goes high or repulsive (thereby isolating the $\phi_1$ electrode) $\phi_1$ again goes low or attractive. $\phi_4$ at this instant, however, is high or repulsive and hence the charge packet is confined under the $\phi_3$ electrode by both $\phi_2$ and $\phi_4$ being high. Moreover, the $\phi_1$ electrode will, though attractive, now is isolated from the charge being propagated and a reference level sensed from the $\phi_1$ electrode will be indicative of that condition. From FIG. 4L, a first clamp signal now is generated to clamp the voltage of a memory capacitor to the current $\phi_1$ level. The voltage developed in the memory capacitor will include the Nyguist noise from the sampling, or clamping function.

The charge subsequently propagates from $\phi_3$ to $\phi_1$: due to $\phi_4$ becoming attractive and $\phi_3$ going repulsive followed by $\phi_4$ going repulsive with $\phi_2$ also repulsive to confine the charge packet under the $\phi_1$ gate electrode. Under this circumstance, the maximum charge packet is confined under the $\phi_1$ electrode—the appropriate time for sampling of that signal level. Accordingly, and as seen in FIG. 4M, a sample voltage pulse is generated for sampling the potential level of the $\phi_1$ electrode during this interval (i.e., while the maximum charge is confined under $\phi_1$). The signal sample then is compared in amplitude with the clamped voltage sensed from the $\phi_1$ electrode in the earlier interval when the $\phi_1$ electrode was isolated from the propagating charge package, and a difference signal is generated. Since Nyquist noise associated with the output reset operation is stored and remains essentially unchanged through the sample operation, the result difference then provides an output signal level which represents the true signal level, independent of the Nyquist noise.

FIG. 4K illustrates the charge distribution levels under the $\phi_1$ electrode for the signal pattern of alternate signal and reference level samples, in accordance with ECDS. As noted, the reference level conveniently is AC zero. Accordingly, the sampling function performed in accordance with the sampling waveform of FIG. 4F provides alternate signal level and reference level samples. The reference sampled in a first shift cycle of the CCD readout is stored on a memory capacitor and compared during the next cycle with the signal level sample. The difference therebetween then is taken as the output signal level sample from the CCD. It should be appreciated in this context that the Nyquist noise rejection is accomplished within each shift cycle of the CCD (i.e. as defined by the completed cycle of $\phi_1$ through $\phi_4$ for shifting a charge packet through and from one stage and into the next). Hence, each of the reference level sample and the signal level sample are corrected individually for the Nyquist noise error by the CDS technique.

The significance of ECDS will be readily appreciated when it is realized that each of the reference level and signal level samples propagates through the identical paths of the CCD. Hence, for a serial input charge injection as shown in FIG. 1A, each charge packet — both reference and signal — has the same residence time in each successive stage of the CCD shift register 10 and each is subjected to the same non-uniformities of threshold levels and leakage current and bias variations. The differencing of the reference and signal level samples of two successive cycles provides for elimination from the final output signal sample of errors occurring due to threshold and leakage current non-uniformities and bias level variations. Thus, full and complete correction for these sources of error is achieved by ECDS. Moreover, ECDS is fully compatible with CDS. The distinction of ECDS correcting for errors from the input to the output of the CCD as contrasted to CDS correcting only for Nyquist noise sampling at the output of any form of analog charge output device, as well, will be readily seen.

Referring again to the analog reconstruction circuit 32 of FIG. 1A, portion 32a comprises a differential input responsive to the differential outputs of the circuits 22 (from the summed input busses 23 thereof), portion 32b performs the CDS function for Nyquist noise cancellation in accordance with the teachings of U.S. Pat. No. 3,781,574, and portion 32c performs the ECDS function.

The differential outputs of circuits 22 from the busses 23, summed and of the relative polarities indicated, are applied to the operational amplifiers 140 and 142 and the differential output thereof is supplied through a further operational amplifier 146 which may serve as a buffer. Single-sided (non-differential) outputs from the function transfer circuits 22 applied to a single summing bus require only a single summing point operation amplifier in lieu of the differential scheme illustrated in circuit portion 32a.

In the CDS section 32b, switch 152 receives the first clamp signal of FIG. 4L at its input terminal 151. When the first clamp is low, switch 152 is open. At the (high) time of the first clamp, switch 152 closes to apply the DC signal bias level $V_C$ to capacitor 148. The potential on the $\phi_1$ electrode, which at this time is isolated from the charge packet, is sensed and the output thereof supplied across the bias established on capacitor 148 to operational amplifier 150. Note in this regard that the signal which is coupled to and stored across capacitor 148 represents the Nyquist noise resulting from this sampling function, since $\phi_1$ currently is isolated from the charge packet (see FIGS. 4G through 4J).

Switch 160 receives the "first sample" signal waveform of FIG. 4M and, accordingly, opens switch 160 to sample the signal level then on electrode $\phi_1$. For the combined ECDS/CDS system here under consideration, and comparing FIG. 4M with FIG. 4K, the first sample will be of a reference level. That sampled reference level is coupled through capacitor 148 and thus differenced with the Nyquist and bias ($V_c$) value signal stored on capacitor 148, and then is supplied through amplifier 150 to switch 160, correctd for the Nyquist sampling error. Switch 160 receives the first sample signal waveform of FIG. 4M, and supplies the Nyquist-correct reference level sample to the common node of memory capacitor 161, for storage thereon, and to the input of operational amplifier 162. The described CDS clamping and sampling operations repeat for each transfer cycle as seen in FIGS. 4L and 4M. Accordingly, the Nyquist noise level is again established on capacitor 148 and upon sampling of the signal level of FIG. 4K (i.e., in the next transfer cycle) the Nyquist noise-corrected, sampled signal level is coupled through operational amplifier 150 to switch 160. Again, switch 160 is closed by the first sample pulse waveform of FIG. 4M and the Nyquist-corrected signal level sample is stored on the storage capacitor 161.

Simultaneously with the next "first clamp" (FIG. 4L) following a reference level sampling, the second reference level clamp (FIG. 4N) occurs; the "second reference clamp" is applied to terminal 171 of switch 172 to close same. A circuit thus is completed to transfer the voltage stored on capacitor 161 (i.e., the reference level voltage) to capacitor 168 for storage thereon.

Switch 180 now receives and is closed by the (AC) true signal sample waveform of FIG. 4O (occurring in the alternate cycles of the second reference clamp of FIG. 4N to complete a circuit from the storage capacitor 161 through amplifier 162, capacitor 168, and amplifier 170 to storage capacitor 183. The signal sample level on capacitor 161 thus is differenced against the reference level stored on capacitor 168 and the difference signal value stored on storage capacitor 83. Hence, operational amplifier 182 provides an output signal corrected both in accordance with CDS and ECDS.

Floating Clock Sensor (Non-destructive readout)

An example of a preferred form of a sensor for non-destructive readout of a CCD suitable for use in FIG. 1A is shown in FIG. 5, particularly comprising a floating clock sensor. The CCD 100 includes a plurality of successive gate electrodes individually labeled . . . $\phi_4$, $\phi_1$, FC, $\phi_3$, and $\phi_4$, $\phi_1$, $\phi_2$ and $\phi_4$ represent a four-phase clock used to drive the CCD. The element FC is a floating clock electrode (corresponding to a $\phi_2$ electrode) from which data propagating down the CCD channel (i.e., in accordance with the four-phase clocking) may be read out non-destructively. In general, the propagation of data through a CCD and the operation of such a device by four-phase clocking is well known. (See, for example, IEEE Journal of Solid-State Circuits, Special Issue, October 1975, "A Non-Volatile Charge-Addressed Memory (Novcam) Cell" by M. H. White, D. R. Lampe, J. L. Fagan, Francis C. Kub, and D. A. Barth, page 281 et seq. (especially the discussion at page 285).

The circuit associated with the floating clock electrode FC includes a transistor 103 operating as a clock reset switch, transistors 101 and 105 which, taken together, comprise a unity gain inverter, and transistor 111 comprising a vertical, bipolar, emitter-follower.

The operation of the circuit of FIG. 5 will be more readily appreciated with respect to the waveforms of FIGS. 6A through 6E. (High levels are repulsive and low levels are attractive to the charge carriers of the illustrative CCD 100.) During the reset interval defined by $\phi 2R$ in FIG. 6B, transistor 103 conducts to couple $\phi 2$ to the floating clock electrode FC, first driving it repulsive (i.e., while high) to force charge toward the $\phi 3$ electrode. Next, as seen in FIG. 6D, $\phi 3$ becomes repulsive to put a barrier in front of the $\phi 2$ (FC) electrode. Then $\phi 2$ goes attractive, followed by the opening of the reset switch (transistor 103) upon $\phi 2R$ going high. The charge packet, however, is at this time confined in the $\phi 4$ electrode well, by $\phi 1$ and $\phi 3$ each being repulsive. The FC electrode well thus receives no charge, although attractive. $\phi 2R$ then terminates, concluding the reset interval and initiating the clamp interval, during which the attractive voltage of the FC electrode, representing the empty FC electrode well, is applied to the gate of the MOS amplifier 101; this level is clamped (stored) in the external sample/hold circuitry 122. Next, in "push-clock" fashion, $\phi_1$ goes attractive "muxing", or gating, the signal charge into the $\phi_2$ well followed by successive pushes of $\phi_4$ and $\phi_1$ going repulsive (i.e., the mux interval). At this time, both the $\phi_1$ and $\phi_3$ electrodes are high and therefore repulsive; as a result, the charge packet is stored in the FC electrode well, the FC electrode having remained attractive, although in a floating state, from the reset interval. Note, moreover, the $\phi 2R$ remains high, and hence the transistor switch 103 remains off, and $\phi 2$ is not coupled to the FC electrode. The sample interval thus initiates with $\phi_1$ going high, and terminates with $\phi_3$ becoming atractive, at which time charge begins to flow from the FC ($\phi_2$) electrode well to the $\phi_3$ electrode well. The sample interval, accordingly, is the time when the signal from the FC electrode is sampled in the external sample/hold circuitry 122.

The external sample and hold circuit 122 typically is connected to receive the output current from resistor 113 — that output current being a function of the voltage of the emitter output 144 of transistor 111 times the conductance of the resistor 113. Alternatively, a read-out may be obtained from the output terminal label $v_o$ connected directly to the emitter 114. The sample and hold circuit 122 then compares the sensed signal with the previously stored clamped value of the FC electrode and determines the difference.

Circuit 122 of FIG. 5, of course, corresponds to circuit 32 of FIG. 1A. Whereas the waveform of FIGS. 6A to 6E provide only for CDS operation of the circuit of FIG. 5, it is apparent that ECDS operation as well may be achieved, through the provision of the circuit portion 32c of FIG. 1A and the appropriate control waveforms.

TDI Operation of ECDS: SENSOR ARRAY READOUT

The basic techniques of ECDS find numerous special applications. A particularly novel one relates to operation in a TDI mode (time delay and integrate) which in the following illustrative teaching provides for enhancement of signal to noise ratios in a sensor array. To more fully appreciate this special application, attention will first be directed to the array structure and certain special provisions which facilitate use of a CCD with the array. Moreover, whereas an infra red optical sensor is suggested in this particular application, it should be appreciated that any type of array device (e.g. acoustical) generating electrical signals which can be coupled into a CCD may be employed in the alternative.

Figure 7:
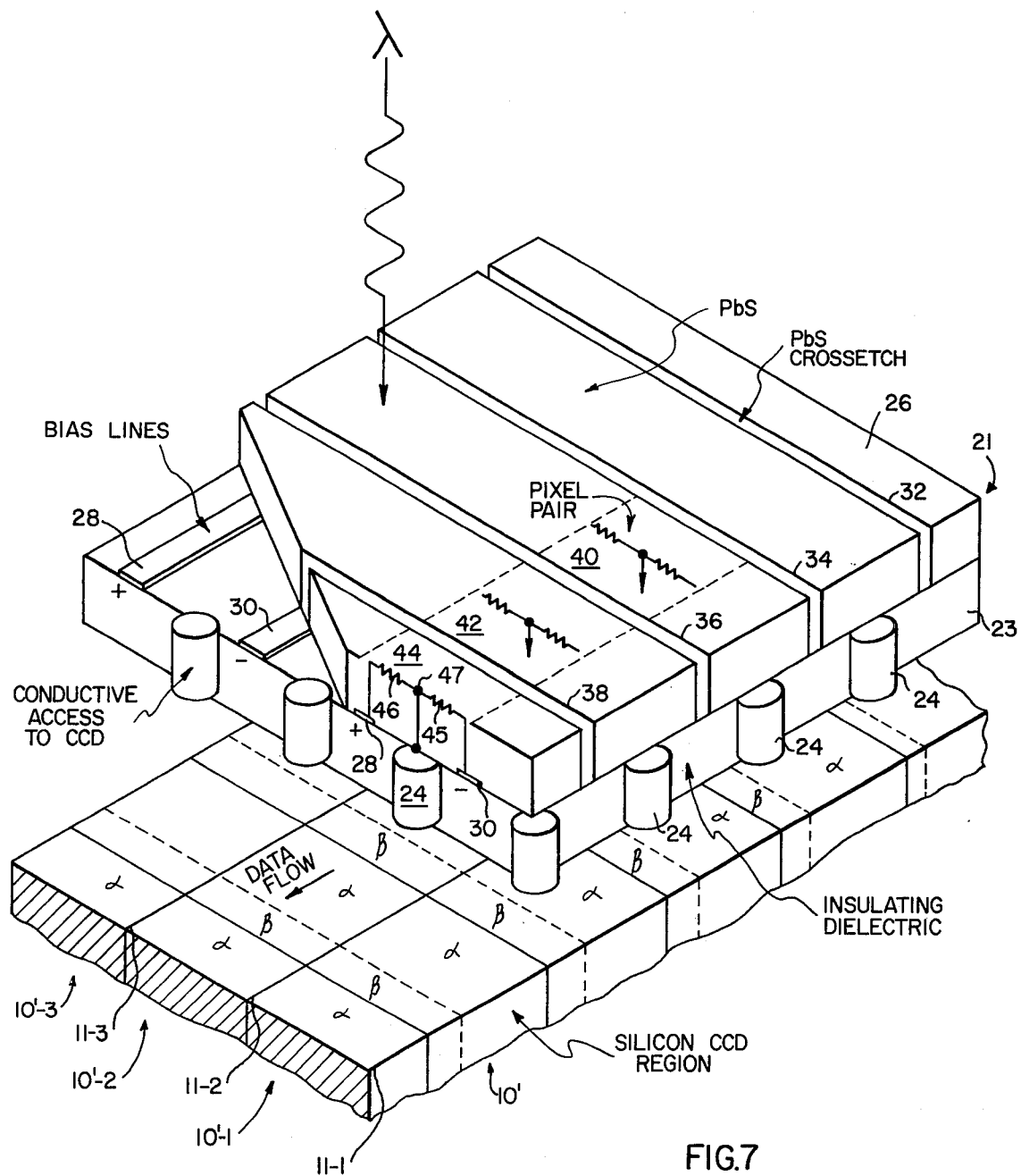
FIG. 7 is a schematic, perspective illustration of a sensor array and associated CCD channels as may be afforded in a monolithic structure for achieving signal enhancement of the sensor outputs in accordance with the techniques of ECDS functioning in a TDI mode.

In FIG. 7 is shown an illustration of a suitable monolithic sensor array and CCD structure for use in accordance with the system of the present invention. The elements of FIG. 7 are shown in a greatly enlarged and exploded arrangement to facilitate description.

The CCD structure 10' is shown as includng three CCD analog shift registers 10'-1, 10'-2 and 10'-3, each composed of a plurality of pairs of stages, each pair including stages designated $\alpha$ and $\beta$. To further emphasize the paired relations, the delineation between the stages $\alpha$ and $\beta$ of a given pair is indicated by a dotted line whereas the successive pairs are delineated by solid lines. It, of course, will be understood that a large number, as desired, of such pairs and such shift registers are employed in a practical system. Moreover, the CCD shift registers and the paired stages thereof are developed in a suitable semiconductor material, such as silicon, with the above-referenced delineations between the plurality of shift registers and the stages of each formed by suitable "channel stop" regions and the associated clock electrode structure, respectively. Particularly, successive ones of the parallel shift registers are defined at the lateral boundaries thereof by what are termed channel stops comprisng suitable barrier-type doped (by implant or diffusion) regions or "high threshold" channel dielectric regions and positioned along the lines 11-1, 11-2, 11-3, etc.

The sensor array and interconnect structure generally designated at 21 is formed by suitable deposition and masking steps onto a surface of the CCD structure 10. the composite structure 21 includes an insulating layer 23, for example silicon dioxide, which, though exploded from the CCD 10' in FIG. 7, would be deposited on the surface thereof. Suitable openings then are formed in the layer 23 to provide conductive interconnects shown as cylindrical elements 24 which provide conductive access to the CCD structure.

The sensor of FIG. 7 may be an infrared sensor and thus the layer 26 may comprise lead sulfide. First, bias lines 28 and 30 are deposited on the insulator layer 22 and may be connected respectively to positive and negative sources of bias potential. A lead sulfide layer 26 then is deposited over the bias lines 28 and 30 onto the surface of insulating dielectric layer 22 and thereafter cross-etched as shown at 32, 34, 36 and 38. The cross-etching in conjunction with the pairs of bias lines 28 and 30 define, in the layer 20, a matrix of individual photosensor elements, a few of which are illustrated at 40, 42 and 44.

Each of the elements 40, 42 and 44 carries a schematic illustration of a sensor electrical circuit extending between the bias lines 28 and 30 and including two series connected resistive elements with the junction thereof making electrical contact to the interconnect elements 24. Such a sensor arrangement is termed a "pixel pair" and would be employed where the incident radiation to be detected is of "point size" and thus selectively may irradiate either of the sensor portions of the pair shown respectively at 45 and 46 for the element 44. A differential output thus is obtained from the series junction 47 depending upon which of the elements 45 and 46 is irradiated. The resulting signal then is supplied through the interconnect 47 to the $\alpha$ stage of a corresponding pair of stages ($\alpha$ and $\beta$) of the CCD analog shift register. By suitable operation of the shift register, to be described, the input signals are shifted through successive ones of the pairs of stages and, within each pair, from the $\alpha$ stage to the $\beta$ stage, in a manner to be described. The direction of data flow thus is indicated by the arrows shown in relation to the shift registers 10'-1 and 10'-2.

Figure 8A:
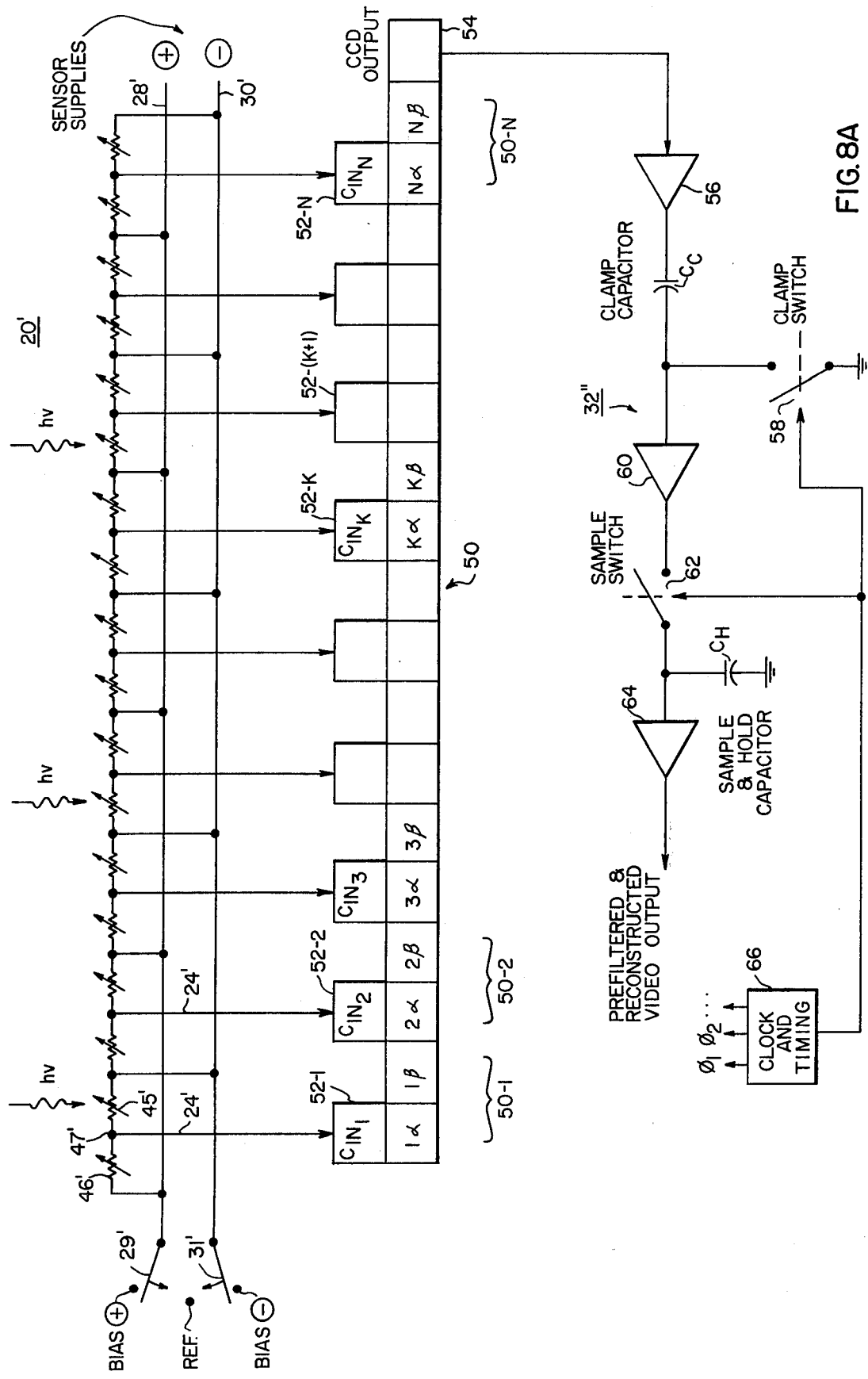
FIG. 8A is a schematic view of one CCD channel and an associated line of sensors of the array for explaining operation of the TDI mode of ECDS.

FIG. 8A is a schematic illustration of one of the CCD analog shift registers of FIG. 2 and the associated sensor line of the sensor array 20, along with certain input and output charge signal circuitry. Paticularly, the shift register 50 may correspond to any one of the shift registers 10-1, 10-2, . . . of FIG. 1 and includesa plurality of N stages 50-1, 50-2 . . . 50-N each including a pair of stages $\alpha$ and $\beta$ — e.g., stage 50-1 includes a pair of stages $1\alpha$ and $1\beta$.

Using identical, but primed numerals to identify elements of FIG. 8A corresponding to those of FIG. 7, the single line of the sensor array 20' shown in FIG. 8 includes a sensor associated with each of the $\alpha$ stages of each of the pairs of stages of shift register 50. Since all are identical, illustration is provided only of the sensor input to stage 50-1 which illustration includes the pixel pair sensors 46' and 45', the effective series junction 47' of which is connected through connector 24' to the first pair 50-1 of shift register stages and; more specifically, through a stabilized charge injector circuit 52-1 labeled $CIN_1$. In like manner, each $\alpha$ stage of the successive pairs includes a stabilized charge injector circuit 52-2, . . . 52-N. The positive and negative bias lines 28' and 30' are shown as supplying energization to the sensors in parallel fashion as provided in FIG. 7.

The N $\beta$ stage of the last shift register stage pair 50-N supplies its output to the CCD output circuit 54. The remaining components of FIG. 8A include an amplifier 56, a clamp capacitor $C_c$, a clamp switch diagrammatically illustrated at 58 and which may comprise a suitable transistor switch, a further amplifier 60, sampling switch 62 which again may comprise a suitably controlled transistor switch, sample and hold capacitor $C_H$, and an output amplifier 64 from which the reconstructed video output of the sensor is derived. These function to provide ECDS processing as described in relation to FIG. 1A for circuit 32.

The outputs of the sensors 46'-45' thus are supplied in parallel to the alternate (e.g. even-numbered) charge injector input stages 52-1 through 52-N. In accordance with the provisions of ECDS, the bias lines 28' and 30' furthermore are connected through respective switches 29' and 31' to respective positive and negative bias potential sources for energization of the sensor elements of the array and, alternately to a common reference potential terminal, at the shift rate of propagation through the CCD 50, as indicated by the arrows schematically shown in FIG. 8A.

As before noted, ECDS is employed in conjunction with the sensor array for enhancement of the signal to noise ratio of the electrical signals derived from the array in response to the incident energization. In the instance indicated, of course, that is infra red radiation — and incident energy is suitably schematically indicated in FIG. 7.

In operation, the image projected onto the array is moved along the line of the array at the same rate as the charge packets are propagated down the stages of the CCD 50. (Recall that the array is two-dimensional as seen in FIG. 7 and that FIG. 8A illustrates only a single line (e.g. column) array). This most readily can be visualized as a point source first energizing the sensors providing an output to charge injector 52-1, that point then moving to the right in FIG. 8A as the injected charge packet propagates from stage 1α to stage 1β of the array.

The reference and sensor output signals of each related pair are selected in the sequence of the reference signal first, since this level alternately will be clamped for the differencing operation against which the sensor signal then is compared for producing the output signal.

Accordingly, in the first shift cycle of the CCD, switches 29' and 31' are closed to the reference potential, effectively shorting out the sensors. The charge injected by injector 52-1 into stage 1 α thus corresponds to the reference level signal. The switches 29' and 31' then open. The CCD executes a shift cycle, advancing the reference charge to stage 1 β and the sensor output signal than is injected into stage 1α.

The next shift cycle advances the reference charge to stage 2α. The switches 29' and 31' again close and the reference potential is injected into stage 2α, adding to the charge already stored therein. At the next shift cycle, switches 29' and 31' open and the same point source is now sensed by the second sensor of the array, producing a corresponding charge injection into stage 2α, adding to the prior sensor signal charge stored therein. It will be appreciated that simultaneously, a next adjacent point source is irradiating the sensors producing a charge injection 52-1 into the first stage 1α.

In accordance with the basic tehniques of ECDS disclosed hereinabove, it then will be appreciated that alternate reference and signal level samples are derived from the CCD output 54 in successive cycle times of the CCD shift register 50. The operational amplifier 56, clamp capacitor $C_c$, clamp switch 58, operational amplifier 60, sample switch 62, sample and hold capacitor $C_H$, and operational amplifier 64 function in accordance with the analog reconstruction circuit 32 of FIG. 1A to provide a reconstructed video output from operational amplifier 64.

It will be readily seen that the clamp switch 58 clamps the voltage of capacitor $C_c$ to the reference level sample and that the sample switch 62 and the sample and hold capacitor $C_H$ operate to difference the signal sample against the reference, thereby to correct for errors due to non-uniform threshold and leakage current variations as well as biasing errors in accordance with ECDS.

Of course it is understood that the signal and reference samples may be in alternate succession so that the signal value is stored and compared with the corresponding succeeding reference signal with a resulting polarity inversion at the output.

The signal enhancement which is accomplished is theoretically proven on the following basis.

As above noted, the scene to be sensed is mechanically scanned across the sensor array. The scanning is done at a rate limited by the characteristic time constant of response of the sensor elements. Moreover, this rate is slow enough to permit the sampling of the electrical reference levels alternately with the sampling of the sensor element outputs.

Where the array has M columns of array elements with $i = 0, 1, 2 \ldots$ M sensor elements per row, the charge injected for the $i_{th}$ sensor is given by $$Q_{sig}^i = \sum_{j=1}^{N} C_{in}^{ij} \cdot [\Delta V_{sig}^{ij} + \Delta V_{Threshold}^{ij}] \text{ where} \quad (13)$$

$C_{in}^{ij}$ = local input charge holding capacitance
$\Delta V_{Threshold}^{ij}$ = local threshold difference between signal gate and charge holding capacitance which gives unwanted fixed pattern charge noise;
$\Delta V^*$ = DC potential difference on charge holding capacitance, which gives a fixed bias charge;
$\Delta V_{sig}^{j} = j^{th}$ signal potential, giving the delayed and added signal.

The charge injected pursuant to Equation (13) supra, during propagation down the CCD shift register, is supplemented at each new injection position with a corresponding charge. It can be shown that this charge, or sensed signal, adds directly. Moreover, for an array of N sensors, it follows that the CCD shift register must have 2N stages to allow for the alternate reference samples. The electrical reference samples may be expressed as:

$$Q_{Ref}^i = \sum_{j=1}^{N} C_{in}^{ij} [\Delta V_{Ref} + \Delta V^* - \Delta V_{Threshold}^{ij}] \quad (14)$$

As noted, both the reference sample and the signal sample of a given pair receive corresponding types of additional injections at each injection position (i.e. in the respectively alternate time periods) as each related pair of signal packets propagates down the shift register channel. However, whereas the signal samples are coherent and add directly, the reference samples are random and add by their RMS values. Accordingly, for N sensors and hence N charge injections and thus N additions to the signal sample, the resulting output signal for the sensor signals is increased in proportion to N. Thus, by the differencing function at the output of the shift register for the reference and signal pair, there results an improvement in the signal to noise ratio in proportion to $\sqrt{N}$. Specifically, the differencing is performed in accordance with:

$$\text{Signal} = Q_{sig}^i - Q_{Ref}^i = (\Delta V_{sig}^i - \Delta V_{Ref}) \cdot \sum_{j=i}^{N} C_{in}^{ij}, \quad (15)$$

It is to be recognized that in this TDI operation, the charge packets for each of the reference and sensed signals have identical dwell times at all points along their propagation paths, with the result that not only are threshold non-uniformities and bias variations fully compensated, but also any CCD leakage non-uniformities are fully compensated, as between the two samples of the pair. DC offset non-uniformities in the sensor differential pair array remain unaffected. However, the latter can be eliminated by opto-mechanically irradiating, uniformly, the monolithic focal point device with the photoconductors continually under proper electrical bias, at the time that the sample of the reference is made. This would involve a sophisticated optical irradiation scheme and, of course, elimination of the switches 29' and 31'.

Figure 8B:
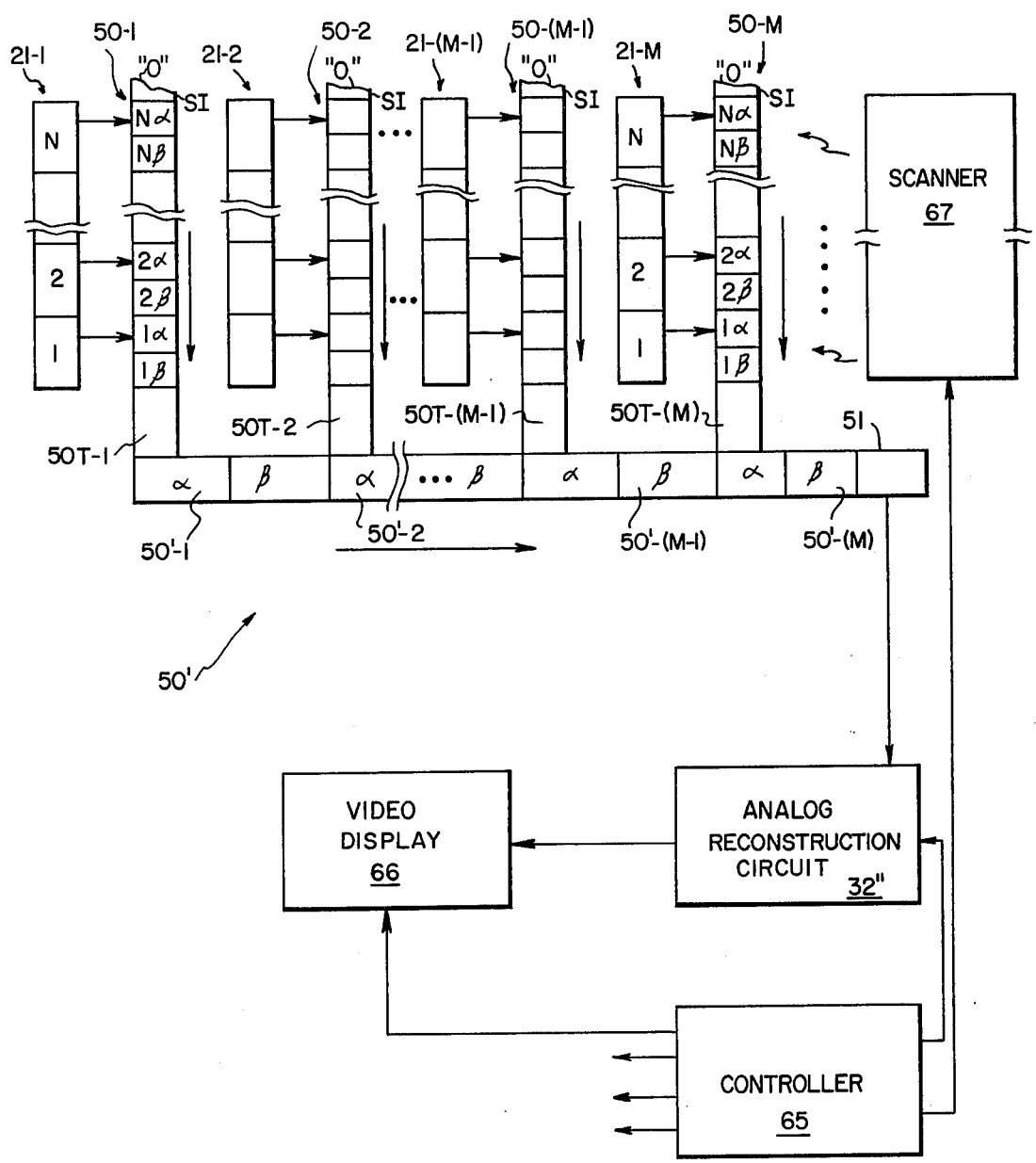
FIG. 8B is a schematic block diagram illustration of CCD processing of the two-dimensional sensor array outputs in accordance with FIG. 8A.

FIG. 8B is a schematic illustration of a TDI scanner and display system in accordance with the invention utilizing ECDS. M columns of sensor elements, each of number N and their associated M CCD shift registers (50-1, 50-2, . . . 50-M) are shown with the respective shift registers supplying their outputs through corresponding transfer gates 50T-1, . . . 50T-M associated with stages 50'-1 through 50'-M of a readout shift register 50'. Controller 65 causes scanner 67 to scan along the N sensor elements of each of the M columns at a rate corresponding to the rate of propagation of signal charge (and reference level charge) packets down the respective individual shift registers associated with the sensors. After injection by pairs of the reference and signal samples at the bottom of the M columns into the shift register 50', controller 65 then shifts the contents of the shift register 50' to the right to sensing by sensor 51 for read-out and supply to analog reconstruction circuit 32'' and thence to a video display 66, in synchronism with each successive horizontal scan of the display 66 (i.e., as in a conventional TV raster scan. Upon completing readout of one line, the next succession of signal pairs from the shift registers associated with the sensor array is advanced into the register 51 and, hence, successive vertically displaced horizontal lines of the display 66 are scanned to reproduce the image initially scanned across the sensor.

Circuit 32'' is shown in simplified form as associated with a single CCD shift register in FIG. 8A and may be implemented as shown in FIG. 1A at 32c. Referring to FIG. 8A, controller 65 closes clamp switch 58 to set the $\beta$ value on clamp capacitor 58, and then opens switch 58. It then closes sample switch 62 so that the $\alpha$ signal is differenced with $\beta$ in being processed through amplifier 56, capacitor $C_c$ and amplifier 60, the difference value being stored in holding capacitor $C_H$. Switch 62 then opens, and the prefiltered and reconstructed video output is supplied through amplifier 64 to the video display 66.

Parallel Signal Injection

The application of ECDS to TDI shown for a sensor array in the preceding section requires parallel signal injection (PI) and serial readout (SO). Parallel injection must be low in noise if signal enhancement is to be realized. The following explains how such a requirement may be satisfied in a CCD system.

A significant source of noise in charge injection arises from the uncertainty associated with the input capacitance $C_{IN}$ and particularly input capacitance non-uniformities $\Delta C_{IN}$. Since input capacitance non-uniformities $(\Delta C_{IN})$ comprise the principal contribution to charge uncertainty in the injection it follows that for a large value of $C_{IN}$:

$$\Delta C_{IN}/C_{IN_k} <<< 1.$$

Therefore, to improve upon the accuracy and hence reduce the uncertainty of charge injection, a large value of input capacitance $C_{IN}$ is desired, requiring in turn large physical dimensions of the input capacitance. The large physical dimensions introduce a further problem, discussed hereinafter in detail, as to adequate speed of propagation of the charge from under the now large capacitance for injection into the CCD shift register. A solution for that problem is now set forth.

Figure 9A:
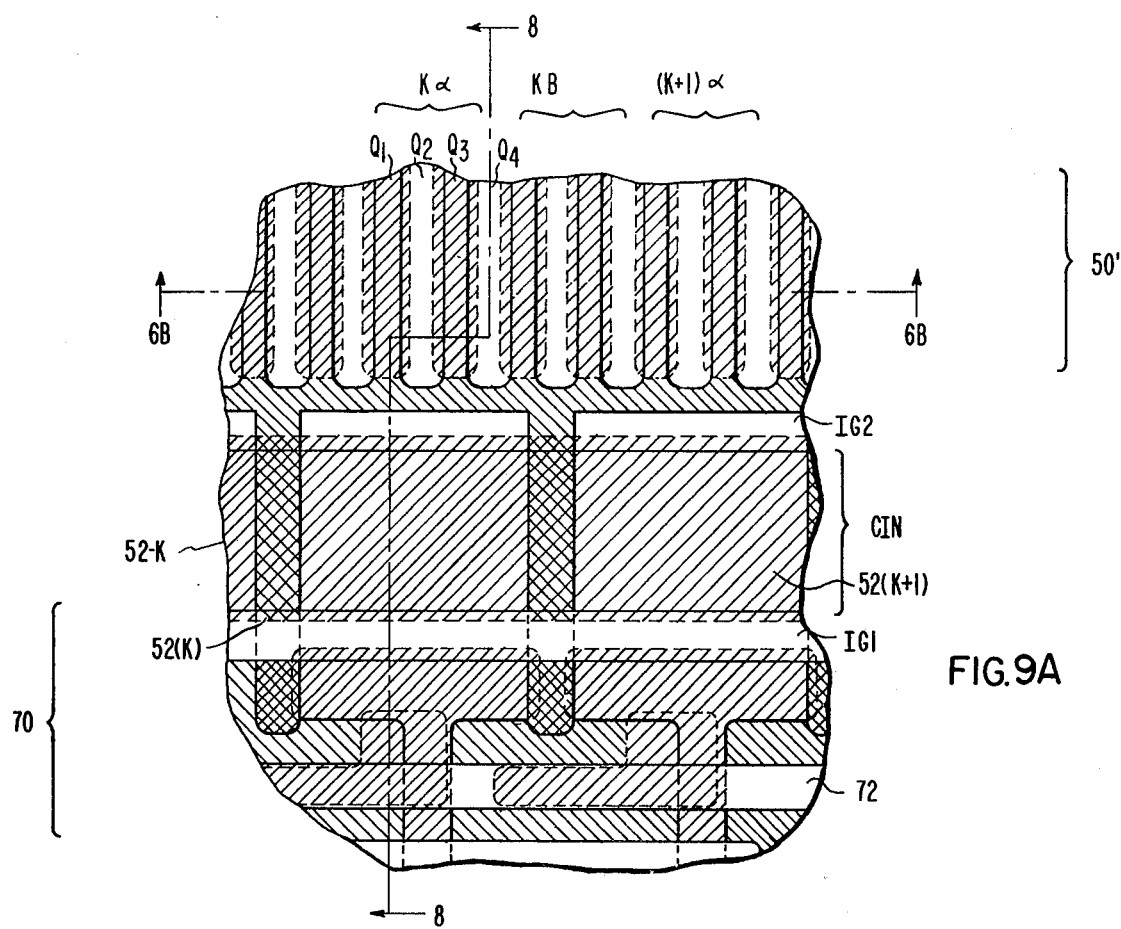
FIG. 9A is a plan view of a CCD shift channel and associated parallel SCI structure.

FIG. 9A is a plan view of a portion of a CCD monolithic structure including a CCD shift register 50' with the CCD channel having stages K$\alpha$, K$\beta$, (K+1)$\alpha$, . . . . The individual gate electrodes, arranged for four-phase clocking are illustrated at $\phi_1$ through $\phi_4$ and are included at each of the successive stages. The portion 70 comprises a stabilized charge injector for injecting charge into the CCD shift register 50'.

The input gate 52(K) of stage (K) having the effective capacitance $C_{IN(K)}$ is seen in FIG. 9A to comprise a relatively large gate electrode 52(K). The gate 52(K+1) as well is seen corresponding to the next stage (K+1). Channel stop 53 separates and thereby isolates the adjacent gate electrodes, and hence the capacitances, to avoid any interaction therebetween. Channel stop 53 also extends in a "T" type configuration as seen in the drawing to include a portion extending from left to right above the conductor IG2. Gate conductor IG1 is also seen in the drawing. The areas V(K)+ annd V(K+1)+ are the signal input gates and may be visualized as corresponding to the arrows at the inputs to the input capacitors 52-(K) and 52-(K+1) in FIG. 8A. Regions labeled PDIN(K) and PDIN(K+1) are the input diffusions, to be discussed. Element 72 is an aluminum stripe which extends across the areas PDIN and electrically ties them together.

Figure 9B:
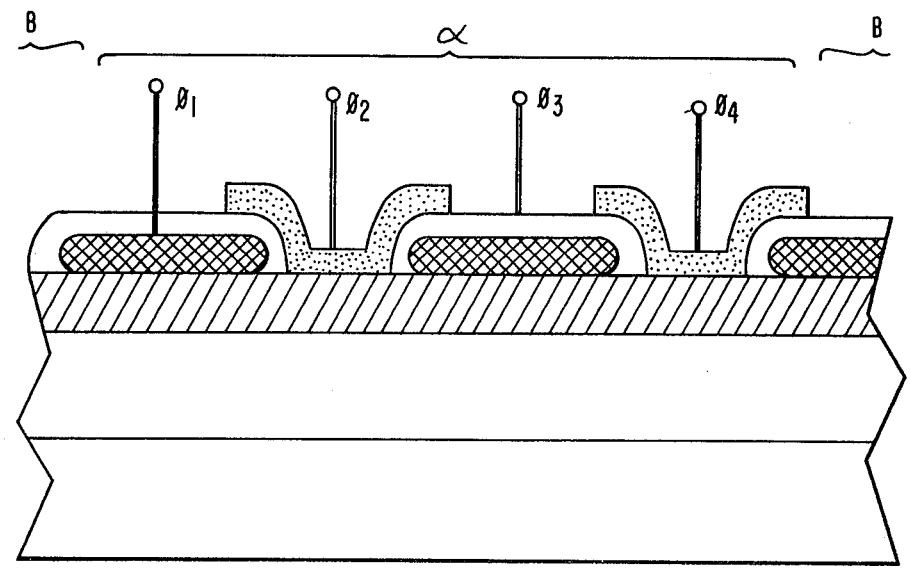
FIG. 9B is a cross section taken along the line 9B—9B of FIG. 9A and showing components of the CCD shift channel.

FIG. 9B illustrates a cross-sectional view taken along the line 9B—9B in FIG. 9A to permit the reader to more readily visualize the arrangement of the successive electrodes $\phi_1$ to $\phi_4$ of the successive pairs of stages $\alpha,\beta$ as exist in the CCD shift register 50'.

Figure 11:
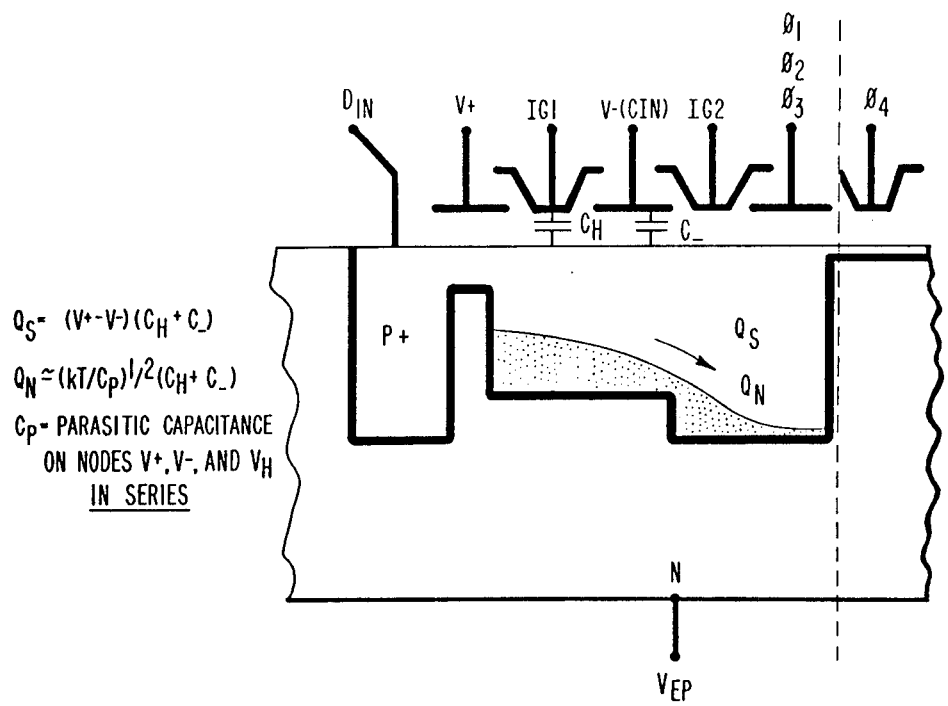
FIG. 11 is a schematic view through a cross section of an SCI for indicating the relationship of electrodes and the waveforms of FIGS. 10A through 10D and resulting potential well conditions.

The injection operation and the shift operation of the structure of FIGS. 9A and 9B will be more readily appreciated with reference to the waveforms of FIGS. 10A through 10H, the schematic cross-sectional illustration of FIG. 11, the latter indicating in essence a cross-sectional view along the line 11—11 in FIG. 9A, and a driving circuit the schematic of which is shown in FIG. 12.

In FIGS. 9A, the regions PDIN correspond to the region P+ with the input $D_{IN}$ in FIG. 11, the region P+ acting as a source of minority carriers during the refill operation as seen in FIG. 11 and subsequently as a drain during the scupper period. The signal input is V+ in FIG. 11 and is correspondingly labeled for the stages (K) and (K+1) in FIG. 9A.

For reasons already explained, the capacitances CIN are of relatively large area, for example 70 microns in width and 56 microns in length, as those relative dimensions are illustrated in FIG. 9A. While this affords an improvement in noise reduction during charge injection, it creates a problem as to achieving adequate speed of propagation of the injected charges from under these large area capacitances into the CCD shift register. In that regard, from FIG. 9A it is to be appreciated that the charge propagates from the capacitor, for example, for the stage (K) into the gate electrodes $\phi_1$, $\phi_2$ and $\phi_3$ of the (K$\alpha$) stage. As will be seen, gate electrode $\phi_4$ creates a barrier during the injection of the charge into this region of the shift register stage.

To achieve adequate speed of propagation of the charges from under the input gate capacitances, successive gates IG1 and V− are provided, which effectively electrically separate the length of the gate capacitances to permit successive pushing of the charge packet from under each such capacitance into the respective receiving stage of the shift register.

With reference to FIGS. 10B and 10C, it will be seen that the signals IG1 and CIN become attractive simultaneously during the refill to attract charges from the P+ diffusion into the input capacitance. This flow of the charges would be into the area, or region, underlying the gates IG1 and V− in FIG. 11. Excess charges are scuppered out from this region down to the level of the signal V+ and thus back into the P+ region which now acts as a drain.

Parallel charge injection occurs in each successive shift cycle for TDI operation, and the interval during which it occurs is shown in relation to FIG. 10A through FIG. 10H. For convenience, the letter descriptions in the following refer both to the waveforms of FIGS. 10A to 10H and the gate structure of FIG. 11. IG1 goes high and therefore repulsive, pushing charges into the neighborhood of CIN. IG2 has become attractive, as have $\phi_1$, $\phi_2$, $\phi_3$. In succession, CIN and IG2 become repulsive, injecting the charges into the stage, then blocking off the parallel structure to permit a series shift of the charge packets.

At the time of the first parallel injection $\phi_4$ is repulsive and creates a barrier; $\phi_1$, $\phi_2$ and $\phi_3$ are attractive; and therefore the injection is achieved.

Again referring to FIGS. 4A through 4H, during the interval labeled "single serial shift", the injected charge is moved forward from the $\alpha$ stage to the $\beta$ stage. Specifically, $\phi_1$, $\phi_2$ and $\phi_3$ successively become repulsive, and $\phi_4$ now is attractive, causing the charge to advance to the last portion of the $\alpha$ stage, i.e., that under the $\phi_4$ electrode. $\phi_1$ becoming attractive followed by $\phi_4$ becoming repulsive then corresponds to the charge packet moving into the $\beta$ stage of the $\alpha/\beta$ pair. Simultaneously, of course, charge injection is occurring into the $\alpha$ stage. For all except the first $\alpha/\beta$ stage pair, each injection results in addition to the existing charge in the $\alpha$ stage of the pairs — alternately being the reference and the signal sample.

As before noted, there is a difficulty with a large input capacitance of assuring adequate speed of propagation of the charges. This is overcome in accordance with the effective electrical dividing of the capacitance by the special electrical pulsing technique relating to the singal waveforms IG1 and CIN. In essence, it is desired that the electrodes create a common potential while the charge is being initially set up in the underlying region, but then provide two successive pushes of the charges from that region during the charge injection operation.

This is accomplished in accordance with the circuit of FIG. 12. The IG1 and CIN logic waveforms are applied to TTL open collector drivers 80 and 82, respectively, the outputs thereof driving PNP transistors 84 and 86, respectively. The transistors 84 and 86 are connected at their emitters to a clock source and at their collectors to a parallel V− supply through resistors 85 and 87, respectively. During set-up of the charge in the common regions of IG1 and CIN, transistors 84 and 86 are effectively turned off by the corresponding logic waveforms applied thereto and, as a result, the outputs from their collectors through the respective resistors 85 and 87 are tied to the parallel V− supply, creating a common low-noise potential condition under these gates.

When IG1 goes high, (FIG. 10B), transistor 84 becomes conductive and hence its output at its collector terminal raises to the level of the clock; the clock presents a high repulsive level, producing the first push function. Subsequently, CIN goes high, turning on transistor 86 and raising its collector output across resistor 87 to the high repulsive level of the clock and providing the further push function.

In conclusion, the foregoing has disclosed the provision of ECDS for CTD systems and wherein, moreover, ECDS is used in conjunction with CDS. A specific application of ECDS in a TDI mode for a sensor array is set forth. Numerous other applications and adaptations and modifications of the ECDS system of the invention will be apparent to those of ordinary skill in the art, and thus it is intended to encompass all such modifications and adaptations of the invention within the true spirit and scope of the appended claims.

1. A system for correction of errors in the output signals from a charge transfer device having a plurality of successive stages through which charge packets, respectively corresponding to analog signal samples, injected into said device are propagated at a preselected shift cycle rate, comprising:
   a source of an input signal and of a reference level signal,
   means for selectively and sequentially sampling said reference level and input signals in a prescribed sequence and at said shift cycle rate, means responsive to said sequence of reference and signal samples for injecting corresponding charge packets into said charge transfer device at an input stage thereof at said shift cycle rate and thus corresponding to the rate of shifting of charge packets to successive stages of said charge transfer device,
   means for sampling, at said shift cycle rate, an output potential at an output stage of said charge transfer device produced by propagation of a charge packet to said output stage, and producing an output sample indicative of said output potential, said output samples including in said prescribed sequence, reference level and signal output samples,
   analog circuit means for selectively responding to the reference and signal output samples of said prescribed sequence for determining the difference in value therebetween and producing an output indicative of the difference as the output signal from the charge transfer device.

2. A system as recited in claim 1 wherein said input sampling means alternately samples the reference level and input signals in sequence, for supplying said reference level and input signal samples, as a related pair, for injection individually and at said shift cycle rate, into said input stage of said charge transfer device.

3. A system as recited in claim 2 wherein said charge transfer device comprises a CCD shift register including a plurality of stages, each stage including a plurality of electrodes for each stage, and
   clocking means providing a sequence of clocking signals, to said electrodes of each stage for successively shifting a charge packet through each said stage and to a successive stage at said cycle rate.

4. A system as recited in claim 3 wherein the clocking means defines a clamping interval and a sample interval in accordance with the sequence of clocking signals provided in each shift cycle, and wherein:
   said sampling means samples the potential of a preselected one of said plural electrodes of said output stage, and is controlled by said clocking means to produce a clamp output during said clamp interval and a sample output during said sample interval, and
   said analog circuit means includes storage means for storing the value of said clamp output from said preselected electrode of said output stage during said clamping interval, and means for determining the difference between the clamped output stored in said storage means and said sample output to provide the difference therebetween as the output signal of said system, thereby removing components of noise from said sample output, contributed by said sampling function.

5. A system as recited in claim 4, wherein said sample output during said sampling interval in a first shift cycle comprises a reference level sample and the sample output in a next successive shift cycle comprises a signal sample, the output signal of said annalog processing circuit thereby comprising the difference between the noise corrected output sample for said reference signal and the noise corrected output sample for said signal sample, to correct for both the effects of noise due to the sampling function and erors due to nonuniformities of threshold and leakage currents of said charge transfer device and said input and output circuitry in producing said output signal.

6. A system for correcting for threshold and leaking current non-uniformities in a charge transfer device having a plurality of successive stags through which a charge packet representative of an input voltage sample is propagated at a prescribed shift cycle rate, comprising:

means for supplying selectively a reference level sample and at least one associated input signal sample, in succession and at the rate of said shift cycle, means responsive to said successively supplied reference level and input signal samples for injecting corresponding charge packets into a stage of said charge transfer device, each such charge packet injection occurring during an injection interval of said shift cycle of said device, means for propagating said charge packets corresponding to said reference level and signal samples through successive stages of said device at said shift cycle rate of said device, means associated with a successive stage displaced from said at least one injection input stage of said device for sampling the potential at said associated successive stage occurring as a result of propagation of each such charge packet through said associated successive stage, to produce an output sample in successive said shift cycles corresponding to said reference level sample and to said at least one input signal sample, means selectively responsive to said output samples, in timed relation to propagation of reference level and signal charge packets through said associated successive stage, for storing a value indicative of the reference level output sample, and for determining the difference between the stored reference level value and the value of the successive, said signal output sample, and providing the resulting difference value, for each said output signal sample, as the output signal of said device, corrected for non-uniformities of thresholds and leakage currents and for bias errors of the above said means.

7. A system as recited in claim 6 wherein said selective supplying means alternately supplies, at the rate of said shift cycle and in succession, a reference level sample and a single associated input signal sample.

8. A system as recited in claim 6 wherein said charge transfer device includes a plurality of means for injecting charge packets into a plurality of said successive stages, successive ones of said plurality of injecting means being displaced with reference to said successive stages by a number of said successive stages corresponding to the number of reference signal samples and associated input signal samples.

9. A system as recited in claim 7 wherein said charge transfer device includes a plurality of said injecting means for injecting charge packets into respectively associated alternate ones of said successive stages of said charge transfer device and defining thereby an intermediate stage between each two successive stages having injecting means associated therewith, whereby in a given first cycle of injection, a charge packet corresponding to a reference level sample is injected by each said injecting means into the respectively associated said stage of said charge transfer device and, in the next successive shift cycle, each said injected charge packet corresponding to a reference level sample advances to said next successive intermediates stage and said injecting means injects a charge packet corresponding to an input signal into said respectively associated stage of said charge transfer device, whereby said charge packets corresponding to reference level and input signal samples are maintained in paired relationship in said adjacent, successive stages of said charge transfer device for propagation therethrough.

10. A system as recited in claim 9 wherein said selective means supplies paired reference level and input signal samples in accordance with each two successive shift cycles to said successive injecting means of said plurality thereof whereby charge packets corresponding to the said same two reference level and input signal samples are summed at each of the said plurality of successive stages associated with said plurality of injecting means.

11. A signal enhancement system employing a charge transfer device having a succession of stages, plural charge injector means associated with alternate ones of said succession of stages for injection of charge packets thereinto, means for advancing charge packets through said successive stages at a predetermined rate, and means for sampling a serial output from the last of the successive stages at said rate, comprising:

selective sampling and supply means including:

means for providing an input signal to be enhanced, means for providing a reference level, means for selecting a sample of said reference level and a sample of said signal to be enhanced in an alternating sequence, at said rate, and supplying said signal and reference level samples in said prescribed sequence in successive shift cycle intervals to the first and each successive charge injector associated with said charge transfer device, whereby the charge packets in the prescribed sequence and corresponding to said signal and reference level samples progress as a related pair through said successive stages of said charge transfer device, each thereof receiving additively a charge packet injection at each said successive injector of the corresponding said signal and reference level samples, said output means sampling the voltage level induced by said summed charge packets and producing corresponding summed output samples in the said prescribed sequence representing respectively the summation values of the signal and reference level samples for each said related pair of samples of said signal to be enhanced and said reference level, at the said rate, and analog circuit means for storing a value corresponding to the said reference level summed output sample and comparing said stored value with the input signal summed output sample of the said related pair of input signal and reference level samples, to determine the difference therebetween, and supplying the said difference as the output signal of said charge transfer device, said output signal being enhanced in amplitude relative to said input signal.

12. A system as recited in claim 11, wherein: said charge packets corresponding to said input signal samples add in proportion to the number of successive injections of charge packets corresponding to said signal sample and said charge packets corresponding to said reference level sample inputs add in proportion to the square root of the number of successive injections of charge packets corresponding thereto, whereby said input signal is enhanced in proportion to the square root of the said number of charge injections.

13. A system for correction of errors in the output signals from a charge transfer device having a plurality of successive stages through which charge packets respectively corresponding to analog signal samples injected into said device are propagated at a preselected shift cycle rate, and including a serial input charge injector and plural parallel output sampling circuits associated with respectively corresponding, plural stages of said charge transfer device, each sampling a potential in its associated stage within a given said shift cycle corresponding to the charge packet then propagating through said stage, comprising:
  a source of an input signal and of a reference level signal,
  means for selectively and sequentially sampling said reference level and input signals in a prescribed sequence and at said shift cycle rate,
  means responsive to said sequence of reference and signal samples for injecting corresponding charge packets into said charge transfer device at at least a preselected input stage thereof and during at least preselected ones of said shift cycles,
  each of said sampling means being operable at said shift cycle rate and during at least a sequence of said shift cycles in which charge packets corresponding to a given prescribed sequence of reference level and input signal samples are propagated through said associated stage, to produce output samples indicative of the output potential of said stage induced by propagation of the said corresponding sequence of charge packets propagating therethrough and corresponding to said reference level and signal samples of said given, prescribed sequence,
  analog circuit means for selectively responding to the reference and signal output samples of said prescribed sequence for determining the difference in value of each said output signal sample relative to said reference level sample of said sequence, and producing an output signal indicative of that difference as the output signal from the said sampling means.

14. A system for correction of errors in the output signals from a charge transfer device having a plurality of successive stages through which charge packets respectively corresponding to analog signal samples injected into said device are propagated at a preselected shift cycle rate and including an input stage into which successive charge packets are injected at said preselected shift cycle rate, comprising:
  a source of an input signal and of a reference level signal,
  means for selectively sampling said reference level and input signal in alternating sequence, at said rate,
  means responding to said alternating sequence of reference and signal samples for injecting corresponding charge packets into said charge transfer device at said input stage thereof and at said rate, whereby successive charge packets propagating through said successive stages of said charge transfer device are related in a pair of sequential reference level and input signal charge packets,
  plural sampling means associated with respective, alternate ones of said successive stages of said charge transfer device, each thereof operable at said rate for sampling the potential of the associated stage induced therein by propagation of a charge packet therethrough and producing output samples indicative of the said potential and in the said sequence of a related pair of reference level output sample and a signal output sample,
  analog circuit means responsive to said sequential reference level and signal output samples of each said related pair to store a value corresponding to said reference level sample and, in the successive cycle, to compare the value of the related signal output sample of the pair and determine the difference therebetween and to supply the said difference value as the output signal from the said sampling means.

15. A system as recited in claim 14 wherein:
  said analog circuit means is separately provided for each said sampling means.

16. A system as recited in claim 14 wherein there is further provided:
  means for summing the successive reference level and signal output samples of related pairs thereof as sampled by said plurality of output sampling means and for summing the plural reference level output samples and summing the plural signal output samples and providing the said summed reference and signal output samples to said analog circuit means and,
  said analog circuit means provides as the output signal of said system, the difference between the summed values of said reference level and signal output samples.

17. A system for enhancement of sensor output signals, comprising:
  a sensor including a plurality of columns of sensor elements, each column including plural sensor elements,
  plural columns of charge transfer devices corresponding to said columns of sensor elements and including a plurality of successive stages related as pairs, said plurality of successive stage pairs respectively corresponding to said plurality of sensor elements of each said column,
  a charge injector associated with the first stage of each successive pair of stages and associated with a corresponding sensor element of the corresponding column of said sensor array,
  means for providing a reference level,
  means for alternately sampling said reference level and the output from a sensor element, for all of said sensor elements, for supply to the respectively corresponding said injectors at the said cyclic rate, said injectors injecting successive charge packets corresponding to said reference level and said sensor output signals in successive shift cycles of said charge transfer devices, means associated with each of said column charge transfer devices for sampling, at said shift cycle rate, an output potential at an output stage of each thereof, produced by propagation of a charge packet to said output stage, and producing an output sample indicative of said output potential, said output samples including, in sequence, alternate reference level and associated sensor signal output samples, and analog circuit means for storing a value corresponding to said reference level output samples and comparing the said stored value with the said sensor signal output samples to determine the difference therebetween and to provide said difference as an output signal from said system.

18. A system as recited in claim 17 wherein said means associated with the output stages of said column charge transfer devices comprises a further charge transfer device having a plurality of successive stages related in pairs, each said pair being associated with a corresponding column charge transfer device for receiving in the first stage of each said pair the output from the last stage of the said associated column charge transfer device, said further charge transfer device thereby receiving injections into each of said pairs of stages thereof in two successive shift cycles of said column charge transfer devices, charge packets corresponding to reference level and sensor element signals, means for operating said further charge transfer device at a shift cycle rate sufficiently higher than the shift cycle rate of said column transfer devices to transfer all of said corresponding pairs of reference level and sensor signal charge packet pairs thereof to an output stage of said further charge transfer device prior to a successive shift cycle of said column charge transfer devices for injecting the first of a successive pair of charge packets from each of said column charge-transfer devices into the corresponding stage pairs of said further charge transfer device, said sampling means samples from said output stage of said further charge transfer device, and said analog circuit means responds to said reference and signal output samples sampled from said output stage of said further charge transfer device.

19. A system as recited in claim 18 wherein there is further provided:

a display means having scanning means for scanning successive ones of vertically displaced rows of said display means in synchronism with the shift cycle rate of said further charge transfer device for each successive shift cycle of said column devices, and means for controlling the intensity of scanning means in proportion to the output signal from said analog circuit means thereby to generate a display on said display means of the image on said sensor array.

20. A system as recited in claim 18 wherein there is further provided:

means for scanning said sensor array at a rate corresponding to the rate of propagation of charges through each of said column charge transfer devices whereby the sensor element output signals sampled by said sampling means associated with the successive, plural charge injectors associated with the successive stages of said column transfer devices supply sensor input signals corresponding to the same elemental portion of the image on said sensor, each said signal and reference level related charge packet propagating through said column charge transfer devices thereby receiving additively a charge packet injection at each said successive injector and the charge packets at the outputs of said column charge transfer devices thereby comprise summation values of the sensor signals corresponding to the same elemental portion of the image displayed on said sensor, said summation charge packets thereby affording corresponding output sensor signal samples from said further charge transfer device increased in amplitude in proportion to the number of said charge injectors due to coherency of the input sensor signal samples whereas the summation charge packets corresponding to reference level input signals are increased in amplitude in proportion to the square root of the number of charge injectors of each column charge transfer device, thereby affording an output signal from said analog circuit means enhanced by a factor of the square root of the number of charge injectors.

21. A system as recited in claim 19 wherein there is further provided:

means for scanning said sensor array at a rate corresponding to the rate of propagation of charges through each of said column charge transfer devices whereby the sensor element output signals sampled by said sampling means associated with the successive, plural charge injectors associated with the successive stages of said column transfer devices supply sensor input signals corresponding to the same elemental portion of the image on said sensor, each said signal and reference level related charge packet propagating through said column charge transfer devices thereby receiving additively a charge packet injection at each said successive injector and the charge packets at the outputs of said column charge transfer devices thereby comprise summation values of the sensor signals corresponding to the same elemental portion of the image displayed on said sensor, said summation charge packets thereby affording corresponding output sensor signal samples from said further charge transfer device increased in amplitude in proportion to the number of said charge injectors due to coherency of the input sensor signal samples whereas the summation charge packets corresponding to reference level input signals are increased in amplitude in proportion to the square root of the number of charge injectors of each column charge transfer device, thereby affording an output signal from said analog circuit means enhanced by a factor of the square root of the number of charge injectors, thereby providing an enhanced display on said display means.

22. A method for correction of errors in the output signals from a charge transfer device having a plurality of successive stages through which charge packets injected into said device and respectively corresponding to analog signal samples are propagated at a preselected shift cycle rate, comprising:

selectively and sequentially sampling a reference level and an input signal in a prescribed sequence and at said shift cycle rate, and injecting corresponding charge packets into said charge transfer device at an input stage thereof at said shift cycle rate and thus corresponding to the rate of shifting of charge packets to successive stages of said charge transfer device, sampling, at said shift cycle rate, an output potential at an output stage of said charge transfer device produced by propagation of a charge packet to said output stage, and producing an output sample indicative of said output potential, said output samples including in said prescribed sequence, reference level and signal output samples, selectively responding to the reference and signal output samples of said prescribed sequence for determining the difference in value therebetween and producing an output indicative of the difference as the output signal from the charge transfer device.

23. A method as recited in claim 22 wherein said charge transfer device comprises a CCD shift register including a plurality of stages, each stage including a plurality of electrodes for each stage, and clocking means providing a sequence of clocking signals to said electrodes of each stage for successively shifting a charge packet through each stage and to a successive stage at said cycle rate, and the clocking means defines a clamping interval and a sensing interval in accordance with the sequence of clocking signals provided in each shift cycle, and further comprising:

sampling the potential of a preselected one of said plural electrodes of said output stage, to produce a clamp output during said clamp interval and a sample output during said sample interval, and storing the value of said clamp output from said preselected electrode of said output stage during said clamping interval and determining the difference between the stored, clamped output cycles to said successive injecting means of said plurality thereof whereby charge packets corresponding to the said same two reference level and input signal samples are summed at each of the said plurality of successive stages associated with said plurality of injecting means.

24. A method of signal enhancement employing a charge transfer device having a succession of stages, plural charge injector means associated with alternate ones of said succession of stages for injection of charge packets thereinto, means for advancing charge packets through said successive stages a a predetermined rate, and means for sampling a serial output from the last of the successive stages at said rate, including the steps of:

providing an input signal to be enhanced,
providing a reference level,
selecting a sample of said reference level and a sample of said signal to be enhanced in an alternating sequence, at said rate, and supplying said signal and reference level samples in said prescribed sequence in successive shift cycle intervals to the first and each successive charge injector associated with said charge transfer device, whereby the charge packets in the prescribed sequence and corresponding to said signal and reference level samples progress as a related pair through said successive stages of said charge transfer device, each thereof receiving additively a charge packet injection at each said successive injector of the corresponding said signal and reference level samples, and sampling the voltage level induced by said summed charge packets and producing corresponding summed output samples in the said prescribed sequence representing respectively the summation values of the signal and reference level samples for each said related pair of samples of said signal to be enhanced and said reference level, at the said rate, and storing a value corresponding to the said reference level summed output sample and comparing said stored value with the signal summed output sample of the said related pair of input signal and reference level samples, to determine the difference therebetween, and supplying the said difference as the output signal of said charge transfer device, said output signal being enhanced in amplitude relative to said input signal.

25. A signal enhancement system as recited in claim 11 wherein:

said charge transfer device includes plural groups of clocking electrodes, each said group defining a stage of said charge transfer device, said plural clocking electrodes being in parallel relationship and extending transversely of said electrodes of said stabilized charge injector, and said means for advancing charge packets comprises control means for providing clocking signals to said electrodes of said charge transfer device of a format for defining said receiving potential well of said charge transfer device under more than one of said clocking electrodes of a stage of said charge transfer device for receiving said flow of charges during the enabling interval of said gate electrode.

26. A stabilized charge injector as recited in claim 25 wherein said control means provides clocking signals to said clocking electrodes of said charge transfer device in a continuous sequence establishing a predetermined shift cycle of charge packet propagation through each successive stage of said charge transfer device, and said clocking signals being generated in timed relationship to said control signals for said gate electrode of said charge injector so as to define said potential receiving well under selected ones of said group of plural electrodes of said associated stage and thereafter to propagate said charge packet along said selected plural electrodes of said group defining said receiving potential well, and then successively rendering the remaining successive electrodes of said group repulsive for isolating said propagating charge packet from said charge injector and continuing the propagation of said charge packet from said associated stage and through successive stages of said charge transfer device at said predetermined cyclic rate.

* * * * *